(12) United States Patent
Bean, Jr. et al.

(10) Patent No.: US 10,952,353 B1
(45) Date of Patent: Mar. 16, 2021

(54) THERMAL BUFFERING MODULE FOR EQUIPMENT RACK

(71) Applicant: SCHNEIDER ELECTRIC IT CORPORATION, West Kingston, RI (US)

(72) Inventors: John H. Bean, Jr., Littlestown, PA (US); James William VanGilder, Pepperell, MA (US); Roy L. Grantham, O'Fallon, MO (US)

(73) Assignee: SCHNEIDER ELECTRIC IT CORPORATION, Foxboro, MA (US)

( * ) Notice: Subject to any disclaimer, the term of this patent is extended or adjusted under 35 U.S.C. 154(b) by 0 days.

(21) Appl. No.: 16/546,344

(22) Filed: Aug. 21, 2019

(51) Int. Cl.
*H05K 7/20* (2006.01)

(52) U.S. Cl.
CPC ..... *H05K 7/20736* (2013.01); *H05K 7/20145* (2013.01); *H05K 7/20172* (2013.01); *H05K 7/20181* (2013.01)

(58) Field of Classification Search
CPC ........... H05K 7/20736; H05K 7/20145; H05K 7/20172; H05K 7/20181
USPC ...................................................... 361/679.5
See application file for complete search history.

(56) References Cited

U.S. PATENT DOCUMENTS

| | | | |
|---|---|---|---|
| 4,600,050 A * | 7/1986 | Noren | H05K 7/20609 165/104.14 |
| 6,059,016 A | 5/2000 | Rafalovich et al. | |
| 6,164,369 A * | 12/2000 | Stoller | H05K 7/20572 165/104.33 |
| 6,591,898 B1 * | 7/2003 | Chu | F28F 1/32 165/104.33 |
| 6,742,583 B2 * | 6/2004 | Tikka | H05K 7/206 165/261 |
| 6,889,752 B2 * | 5/2005 | Stoller | H05K 7/206 165/122 |
| 6,924,981 B2 * | 8/2005 | Chu | H05K 7/20754 165/104.33 |
| 7,154,748 B2 * | 12/2006 | Yamada | H05K 7/20572 361/690 |
| 7,254,022 B2 * | 8/2007 | Ebermann | H05K 7/20754 361/696 |

(Continued)

FOREIGN PATENT DOCUMENTS

DE   102012112646 A1   6/2014

OTHER PUBLICATIONS

Notification of Transmittal of the International Search Report and the Written Opinion of the International Searching Authority from corresponding PCT/US2020/047183 dated Nov. 26, 2020.

*Primary Examiner* — Anatoly Vortman
(74) *Attorney, Agent, or Firm* — Lando & Anastasi, LLP

(57) ABSTRACT

A thermal buffering module is used in a combined equipment and cooling unit including a housing defining an interior configured to receive electronic equipment, with the electronic equipment being supported by the housing. The combined equipment and cooling unit further includes a cooling unit supported by the housing. The thermal buffering module includes at least one heat exchanger. The thermal buffering module is configured to selectively receive chilled air from the cooling unit to cool the at least one heat exchanger and to selectively receive warm IT air from the electronic equipment to cool the warm IT air as it travels over the at least one heat exchanger.

21 Claims, 17 Drawing Sheets

(56) References Cited

U.S. PATENT DOCUMENTS

| | | | | |
|---|---|---|---|---|
| 7,813,121 B2* | 10/2010 | Bisson | H05K 7/20736 | 361/679.5 |
| 7,903,403 B2* | 3/2011 | Doll | H05K 7/20736 | 361/679.48 |
| 7,969,727 B2* | 6/2011 | Tozer | H05K 7/20827 | 361/679.47 |
| 8,051,672 B2* | 11/2011 | Mallia | H05K 7/20754 | 165/104.33 |
| 8,139,358 B2* | 3/2012 | Tambe | G06F 1/20 | 165/104.33 |
| 8,199,485 B2* | 6/2012 | Cheng | H05K 7/20727 | 361/679.48 |
| 8,199,500 B2* | 6/2012 | Yamagiwa | H05K 7/20127 | 165/104.34 |
| 8,223,492 B2* | 7/2012 | Ji | H05K 7/20572 | 361/679.48 |
| 8,325,478 B2* | 12/2012 | Siracki | H05K 7/20163 | 361/678 |
| 8,325,479 B2* | 12/2012 | Siracki | H05K 7/20918 | 361/678 |
| 8,335,081 B2* | 12/2012 | Weiss | H05K 7/20163 | 361/694 |
| 8,345,419 B2* | 1/2013 | Sun | H05K 7/20736 | 361/679.46 |
| 8,446,725 B2* | 5/2013 | Lam | H05K 7/20145 | 361/679.5 |
| 8,456,839 B2* | 6/2013 | Shirakami | H05K 7/20572 | 361/690 |
| 8,503,178 B2* | 8/2013 | Chen | F28D 1/024 | 361/679.48 |
| 8,672,732 B2* | 3/2014 | Rasmussen | H05K 7/2079 | 454/184 |
| 8,934,242 B2* | 1/2015 | Bean, Jr. | H05K 7/20745 | 165/104.33 |
| 8,944,896 B2* | 2/2015 | Womac | H05K 7/1425 | 361/690 |
| 9,863,428 B2* | 1/2018 | Tsujimoto | H02M 7/003 | |
| 10,004,163 B2* | 6/2018 | Smith | H05K 7/20736 | |
| 2002/0126449 A1* | 9/2002 | Casebolt | H05K 7/20736 | 361/679.46 |
| 2003/0053293 A1* | 3/2003 | Beitelmal | H05K 7/20836 | 361/679.49 |
| 2003/0223193 A1* | 12/2003 | Smith | H05K 7/20581 | 361/679.48 |
| 2003/0223199 A1* | 12/2003 | Smith | G06F 1/181 | 361/727 |
| 2004/0109288 A1* | 6/2004 | Beitelmal | F25D 17/06 | 361/679.53 |
| 2005/0061485 A1* | 3/2005 | Hirafuji | F28D 15/0233 | 165/104.21 |
| 2005/0168945 A1* | 8/2005 | Coglitore | H05K 7/20736 | 361/695 |
| 2007/0274039 A1* | 11/2007 | Hamlin | H05K 7/2019 | 361/695 |
| 2008/0055846 A1* | 3/2008 | Clidaras | H05K 7/2079 | 361/679.41 |
| 2008/0094799 A1* | 4/2008 | Zieman | F28F 9/0268 | 361/695 |
| 2008/0113604 A1* | 5/2008 | Tufford | G06F 1/20 | 454/187 |
| 2012/0297807 A1* | 11/2012 | Canney | H05K 7/1497 | 62/228.4 |
| 2013/0048647 A1* | 2/2013 | Farrar | F25D 11/006 | 220/592.01 |
| 2013/0174421 A1* | 7/2013 | Chainer | H05K 7/20827 | 29/890.03 |
| 2016/0174418 A1 | 6/2016 | He et al. | | |
| 2016/0338230 A1 | 11/2016 | Kaplan et al. | | |
| 2017/0188486 A1* | 6/2017 | VanGilder | H05K 7/20836 | |
| 2018/0224217 A1* | 8/2018 | Grantham | F28F 3/083 | |

* cited by examiner

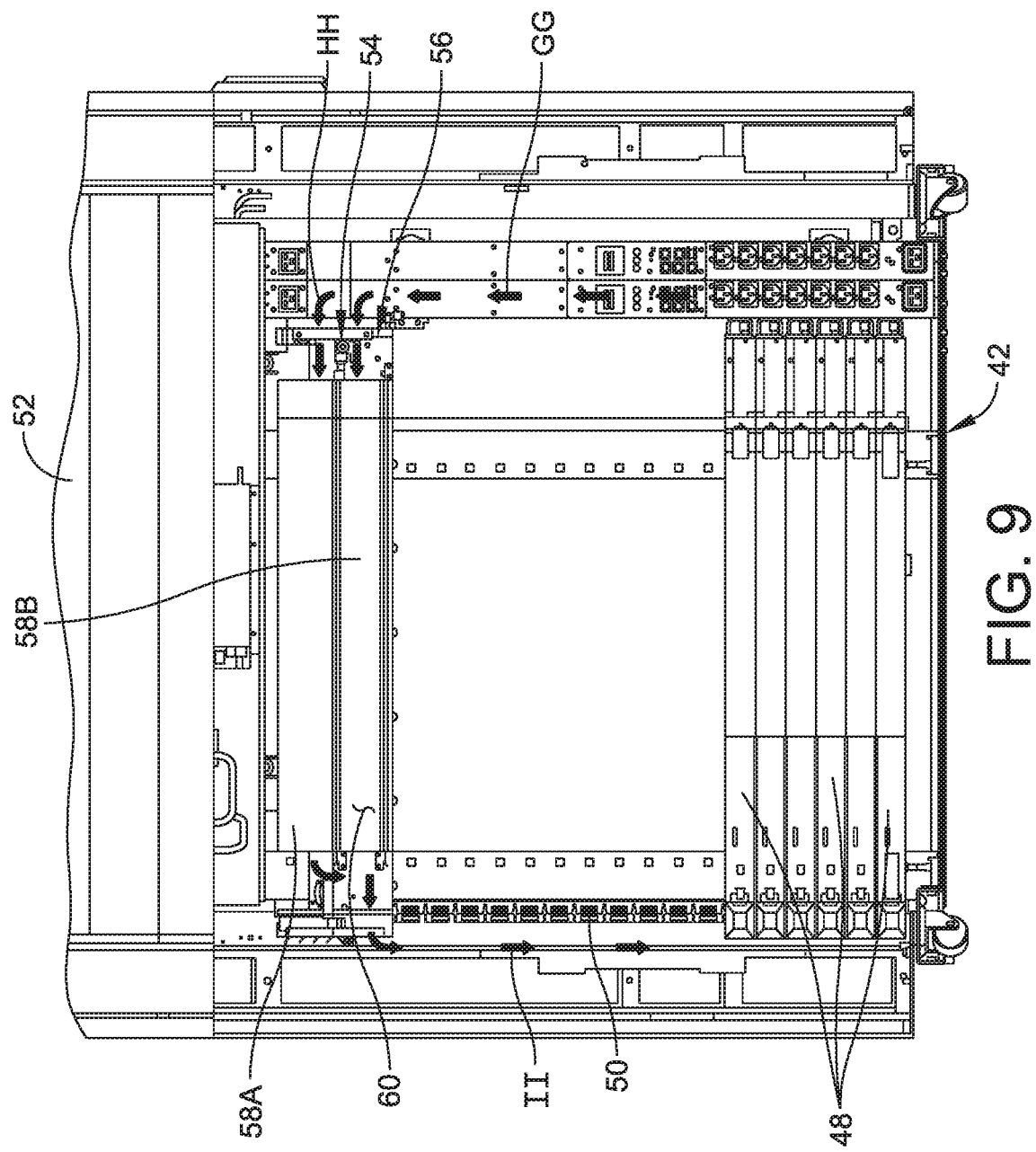

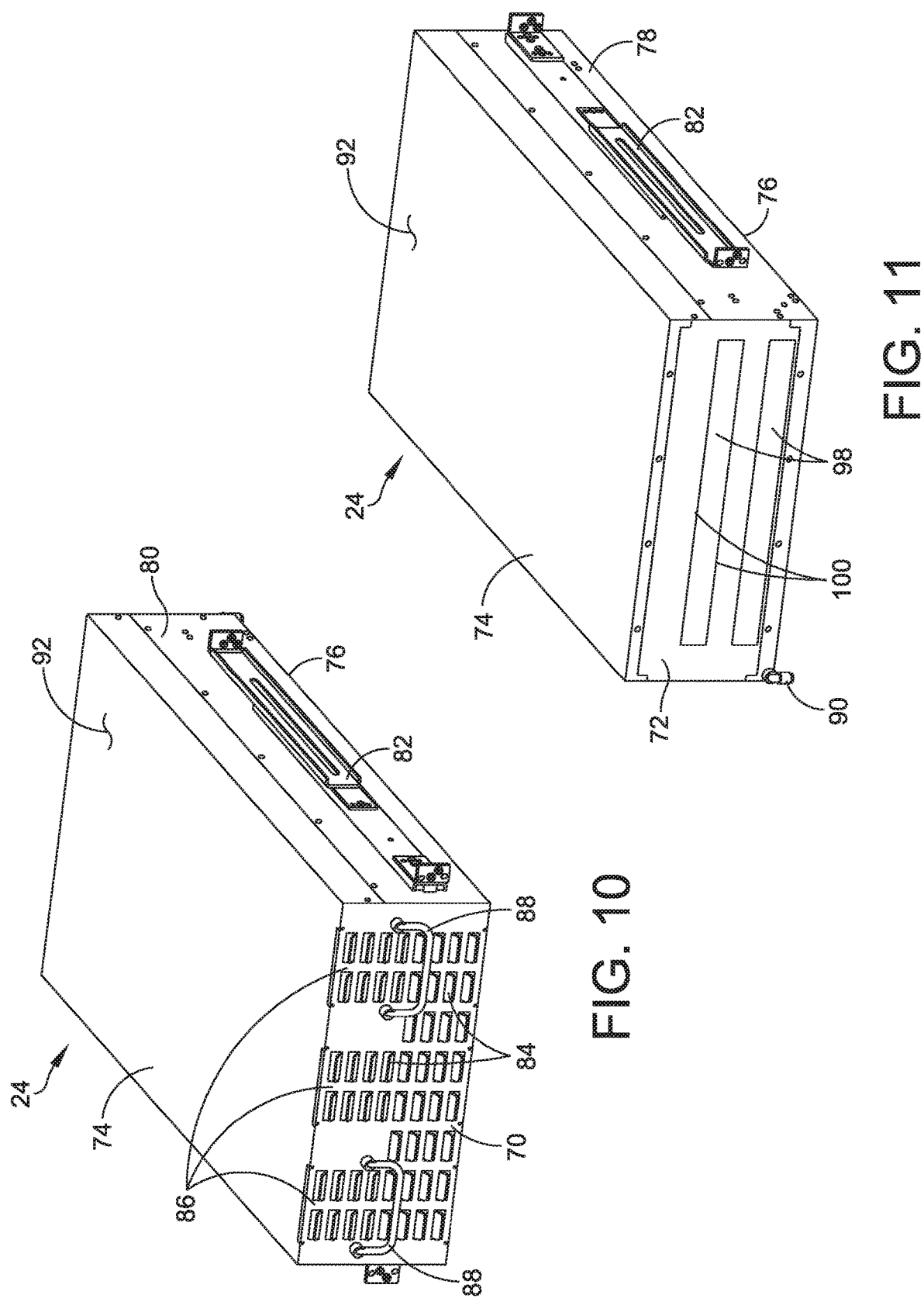

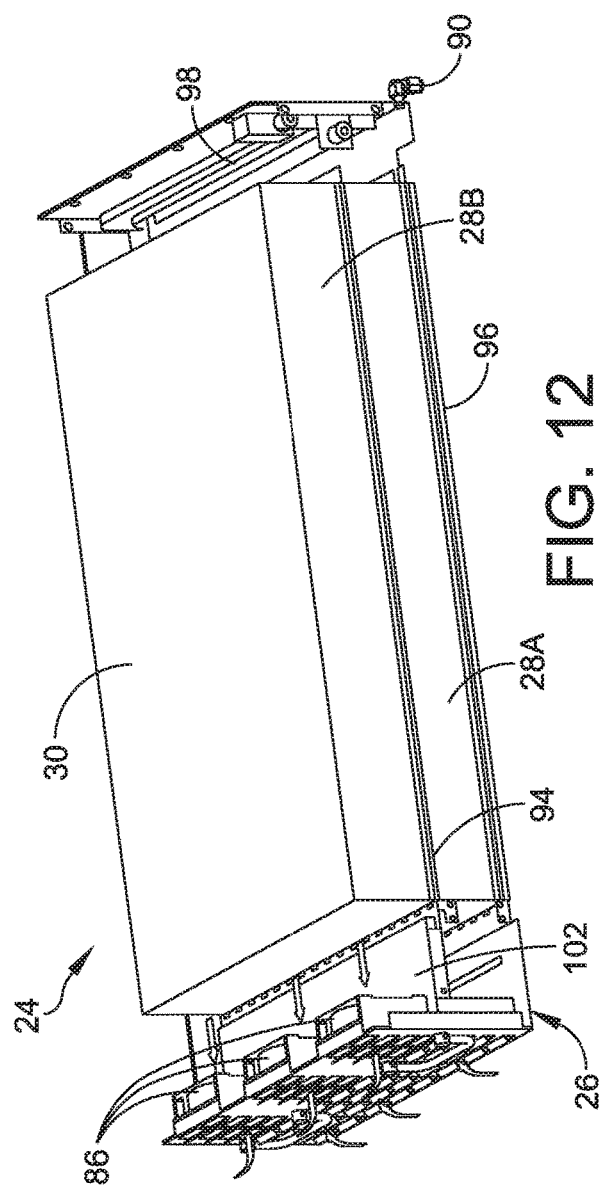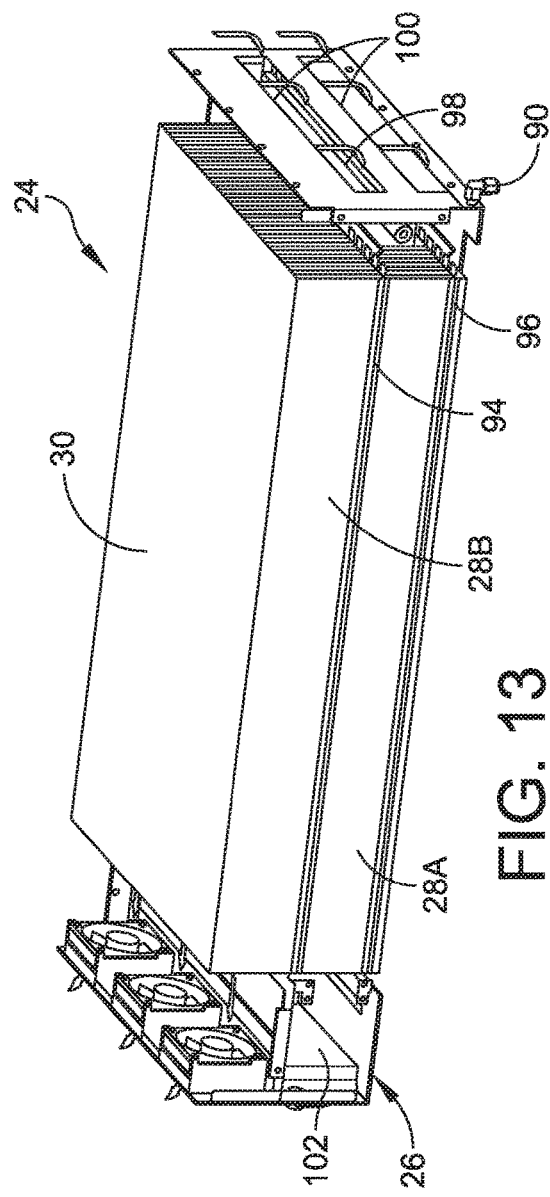

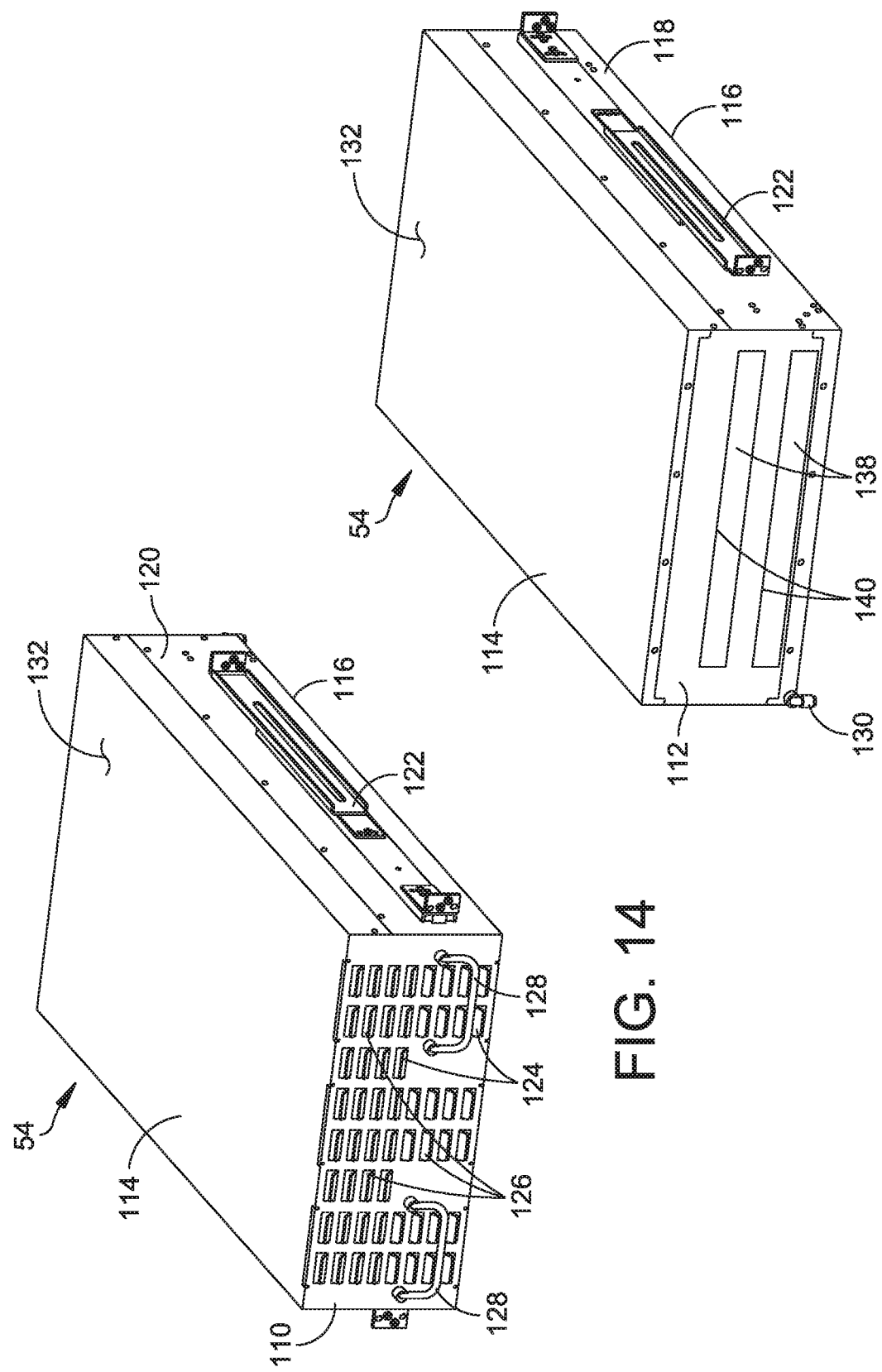

THERMAL BUFFERING MODULE FOR EQUIPMENT RACK

BACKGROUND OF DISCLOSURE

1. Field of Disclosure

Aspects of the present disclosure relate generally to data centers, including microdata centers, small rooms and closets, that contain racks and enclosures used to house data processing, networking and telecommunications equipment, and more particularly to cooling systems and methods used to cool equipment housed by such racks and enclosures.

2. Discussion of Related Art

Equipment enclosures or racks for housing electronic equipment, such as data processing, networking and telecommunications equipment have been used for many years. Such racks are used to contain and to arrange the equipment in small wiring closets, microdata centers, small rooms, as well as equipment rooms and large data centers. An equipment rack can be an open configuration and can be housed within a rack enclosure, although the enclosure may be included when referring to a rack. With the ever-decreasing size of computer equipment, and in particular, computer servers and blades, the number of electrical devices mounted in each rack has been increasing, raising concerns about adequately cooling the equipment.

Heat produced by rack-mounted equipment can have adverse effects on the performance, reliability and useful life of the equipment components. In particular, rack-mounted equipment, housed within an enclosure, may be vulnerable to heat build-up and hot spots produced within the confines of the enclosure during operation. The amount of heat generated by a rack of equipment is dependent on the amount of electrical power drawn by equipment in the rack during operation. In addition, users of electronic equipment may add, remove, and rearrange rack-mounted components as their needs change and new needs develop.

SUMMARY OF DISCLOSURE

One aspect of the present disclosure is directed to a thermal buffering module for use in a combined equipment and cooling unit including a housing defining an interior configured to receive electronic equipment, with the electronic equipment being supported by the housing within an interior of the housing. The combined equipment and cooling unit further includes a cooling unit supported by the housing. The thermal buffering module comprises at least one heat exchanger. The thermal buffering module is configured to selectively receive chilled air from the cooling unit to cool the at least one heat exchanger and to selectively receive warm IT air from the electronic equipment to cool the warm IT air as it travels over the at least one heat exchanger.

Embodiments of the thermal buffering module further may include a support housing. The support housing may be configured to slide into and out of the interior of the housing of the combined equipment and cooling unit. The support housing may include a louvered surface. The support housing may include at least one fan. The at least one heat exchanger may include a first air passage and a second air passage. The first air passage may be separated from the second air passage by a divider. The thermal buffering module may further be configured to operate in a charging mode of operation in which chilled air produced by the cooling unit is directed over the at least one heat exchanger and warm IT air produced by the electronic equipment is directed through the cooling unit. The thermal buffering module may further be configured to operate in a discharging mode of operation in which warm IT air produced by the electronic equipment is directed through the thermal buffering module and over the at least one heat exchanger to cool the warm IT air. The thermal buffering module further may include a first air inlet damper to selectively enable or inhibit warm IT air from entering the thermal buffering module. The first air inlet damper may be configured to rotate between an open position to enable air to pass through vents provided in a support housing and a closed position. The thermal buffering module further may include a second air inlet damper to selectively enable or inhibit chilled air from entering the thermal buffering module. The second air inlet damper may be configured to rotate between an open position to enable air to pass through openings of the front of the support housing and a closed position. When in a charging mode of operation, the first damper may be closed to inhibit warm IT air from entering the back of the thermal buffering module and warm IT air travels to the cooling unit to be chilled by the cooling unit, and the second damper may be opened to enable chilled air to enter the front of the thermal buffering module so that the chilled air enters the at least one heat exchanger to cool the at least one heat exchanger. When in a discharging mode of operation, the first damper may be opened to enable warm IT air to enter the back of the thermal buffering module so that the warm IT air travels over the at least one heat exchanger, and the second damper may be closed. The at least one heat exchanger may include a multiwall panel assembly having a first panel, a second panel, and a plurality of cross members that extend between the first and second panels to create columns. The at least one column may be filled with a thermal transfer fluid. The columns may be sealed by plastic caps in contact with at least one end of the panel assembly.

Another aspect of the disclosure is directed to a computer readable medium configured to cause a controller to perform a method of cooling warm IT air in a combined equipment and cooling unit. The combined equipment and cooling unit includes a housing defining an interior configured to receive electronic equipment, with the electronic equipment being supported by the housing within an interior of the housing. The combined equipment and cooling unit further including a cooling unit supported by the housing, and a thermal buffering module. The thermal buffering module includes at least one heat exchanger. The method comprises: in a charging mode of operation, chilled air produced by the cooling unit is directed over the at least one heat exchanger of the thermal buffering module and warm IT air produced by the electronic equipment is directed through the cooling unit; and in a discharging mode of operation, warm IT air produced by the electronic equipment is directed through the thermal buffering module and over the at least one heat exchanger to cool the warm IT air.

Embodiments of the computer readable medium further may include configuring the thermal buffering module with a first air inlet damper to selectively enable or inhibit warm IT air from entering the thermal buffering module. The first air inlet damper may be configured to rotate between an open position to enable air to pass through vents provided in the support housing and a closed position to block air from passing through the vents. A second air inlet damper may be configured to selectively enable or inhibit chilled air from entering the thermal buffering module. The second air inlet damper may be configured to rotate between an open position to enable air to pass through openings provided in the support housing and a closed position to block air from passing through the openings. When in a charging mode of operation, the first damper may be closed to inhibit warm IT air from entering the back of the thermal buffering module and warm IT air travels directly to the cooling unit to be chilled by the cooling unit, and the second damper may be opened to enable chilled air to enter the front of the thermal buffering module so that the chilled air enters the at least one heat exchanger to cool the at least one heat exchanger. When in a discharging mode of operation, the first damper may be opened to enable warm IT air to enter the back of the thermal buffering module so that the warm IT air travels directly over the at least one heat exchanger, and the second damper may be closed to inhibit chilled air to enter the front of the thermal buffering module.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings:

FIG. 9 is a cross-sectional side view of the combined equipment and cooling rack in an "off" cooling mode;

FIGS. 10 and 11 are front and back perspectives view of a thermal buffering module used with the combined equipment and cooling rack shown in FIGS. 2-5;

FIG. 12 is a perspective view of the thermal buffering module shown in FIGS. 10 and 11 with a top cover removed to reveal the thermal buffering module in an "on" cooling mode;

FIG. 13 is a perspective view of the thermal buffering module shown in FIGS. 10 and 11 with the top cover removed to reveal the thermal buffering module in an "off" cooling mode;

FIGS. 14 and 15 are front and back perspective views of a thermal buffering module used with the combined equipment and cooling rack shown in FIGS. 6-9;

DETAILED DESCRIPTION

Figure 1:
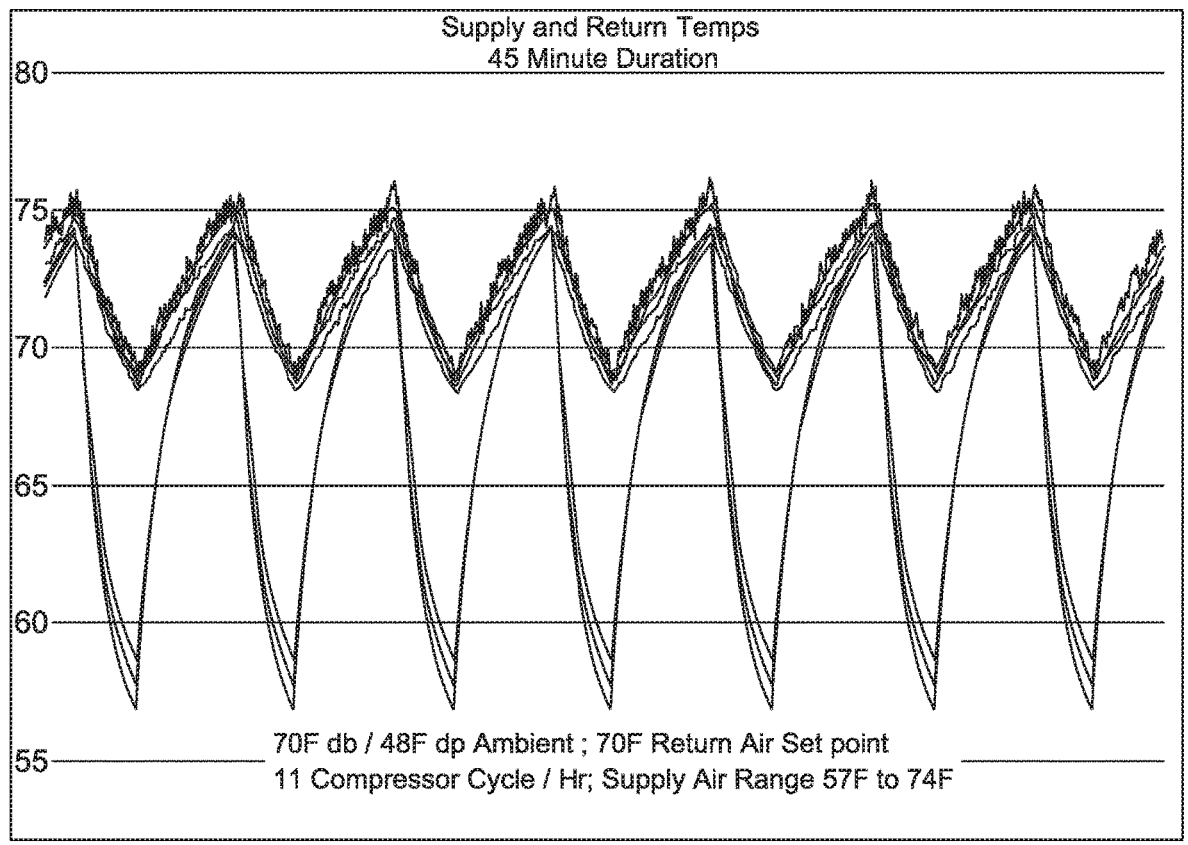
FIG. 1 is a graph showing supply and return temperatures over time of a self-contained cooling unit of an enclosed equipment rack.

This disclosure is not limited in its application to the details of construction and the arrangement of components set forth in the following description or illustrated in the drawings. The principles set forth in this disclosure are capable of being provided in other embodiments and of being practiced or of being carried out in various ways. Also, the phraseology and terminology used herein is for the purpose of description and should not be regarded as limiting. The use of "including," "comprising," "having," "containing", "involving", and variations thereof herein, is meant to encompass the items listed thereafter and equivalents thereof as well as additional items.

All-in-one equipment racks may be used in microdata centers for edge application, which are typically deployed in closets or other locations without adequate cooling resources. These applications use racks sealed from the surrounding ambient air for physical security and environment protection. This requires the cooling apparatus to be enclosed in the equipment rack with the cooling equipment. Frequently, there is significant mismatch between cooling capacity and heat load (cooling grossly oversized). This gives rise to erratic temperatures and need for expensive or impractical capacity modulation schemes. Referring to FIG. 1, the illustrated graph represents a typical test data of a self-contained air conditioner cooling an enclosed rack with thermal IT load significantly below capacity of the cooling unit. The result of mismatch of load and capacity is a high compressor cycle rate, and high amplitude temperature fluctuations. Both of these mismatches are potentially harmful to the longevity of equipment.

There are systems that employ electric re-heaters to offset surplus cooling capacity of oversized cooling units. These systems may be inefficient and some have been phased out in various jurisdictions. Other systems may include complex and expensive capacity management systems that reduce cooling capacity surplus. Other inefficient systems may employ hot-gas-reheat systems that offset excessive cooling.

At least one embodiment of the present disclosure is directed to a modular cooling unit that is selectively positionable to cool electronic equipment housed within equipment enclosures or racks of a data center. As used herein, "enclosures" and "racks" are used to describe apparatus designed to support electronic equipment. Such a cooling system is capable of employing one or more cooling units on an as needed basis to provide localized cooling within the enclosure. As disclosed herein, the cooling unit embodies a combined equipment and cooling rack.

Data centers are typically large rooms designed, in certain instances, to house hundreds of electronic equipment racks arranged in rows within the data center. The rows of equipment racks are arranged in such a manner that there are cold aisles and hot aisles. The cold aisles provide access to the fronts of the enclosures where the electronic equipment is typically accessed. The hot aisles provide access to the backs of the equipment racks. As requirements change, the number of equipment racks may be increased or decreased depending on the functional requirements of the data center. At least one embodiment of the cooling unit of the present disclosure is modular and scalable. Also, although relatively large data centers are discussed as an intended use for such a cooling system incorporating cooling units, as mentioned above, the cooling units of the present disclosure may be employed in microdata centers and smaller rooms on a smaller scale.

Data center (including microdata centers) climate management may be performed using direct expansion (DX) cooling units within or on top of sealed housings of the equipment racks. These DX cooling units are not well-suited to provide stable temperature conditions within the rack. Embodiments of the present disclosure enhance temperature stability by actively smoothing net cooling available to IT heat loads, thereby reducing frequency and amplitude of temperature fluctuations seen by IT equipment. In some embodiments, a combined equipment and cooling unit may have thermal mass contained within heat exchangers, which are in thermal contact with the airflow within the rack. The unit further may have flow control dampers and fans to manage excess cooling from the cooling unit during over cooling (charging of "cool" reservoir), or provide thermal sink for thermal energy released from IT equipment while the compressor is not operating (discharge of "cool" reservoir).

In certain aspects, heat exchangers are arranged within a standard rack unit enclosure. The heat exchangers contain high heat capacity thermal mass, such as phase change materials (e.g., hydrated salts), water, etc. Airflow may be directed and controlled within the enclosure in communication with airflow in the rack as required to source thermal load from heat exchange during surplus capacity, and sink thermal load from IT equipment into heat exchangers during deficit of cooling unit cooling (i.e., compressor is "off"). A control system monitors the compressor cycling frequency and temperature rate of change to provide an assessment of intervention by the thermal buffering module and guides a user as to when and if a thermal load within the equipment rack has reached acceptable balance with the cooling unit.

Excessive cooling capacity may produce lower than desired discharge (supply) air temperature from the cooling unit. The combined equipment and cooling unit of some embodiments of the present disclosure detects low discharge air temperature and scavenges a portion of the excessively cooled discharge from cooling unit through the unit, where the air will thermally absorb heat from the thermal mass of the thermal buffering module, with the thermal mass having been previously warmed during off cycle of cooling unit. The scavenged and tempered air will then be discharged by the fans within the unit back into the balance of the excessively cooled cooling units discharge air.

During off cycles of the cooling unit compressor the air loop in the rack will warm rapidly. In one embodiment, the described combined rack detects sudden rise of discharge temperature and modifies the airflow path within the unit to draw air heated by the IT equipment from the back of the rack across a heat exchange surface with previously cooled thermal mass of the thermal buffering module. The cool thermal mass within the unit will absorb a portion of heat introduced from the IT equipment. Fans within the unit will then discharge the cooled air into the front plenum of the rack, making this cooler air available for the IT equipment until such time the cooling units begins actively cooling again.

In another embodiment, the combined rack is configured to direct warm IT air produced by the IT equipment over the thermal buffering module and the cooling unit is cycled on and off to cool the thermal mass of the thermal buffering module to thereby cool the warm IT air.

The reduced cycling and extra heat load (reducing net surplus cooling) allows the combined equipment and cooling unit to consume less energy.

In some embodiments, the combined rack actively and bi-directionally exchanges heat between air within the rack and high heat capacity thermal mass contained within heat exchangers to reduced cycle rate of compressor, or reduced amplitude of temperature fluctuations.

Figure 3:
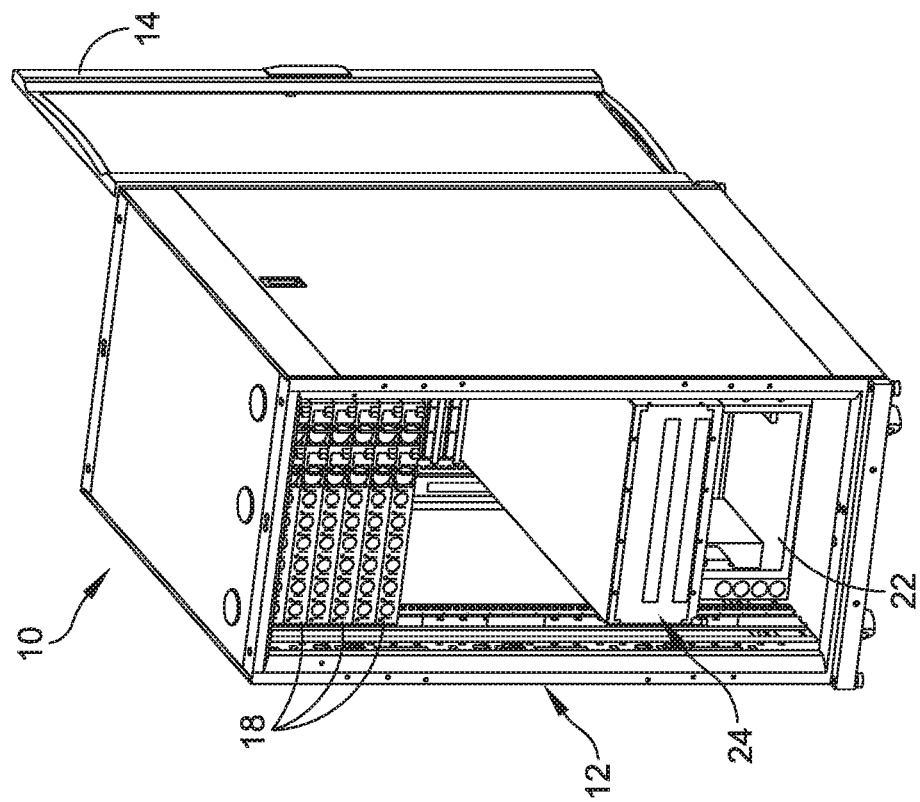
FIG. 3 is a back view of the combined equipment and cooling rack.
Figure 2:
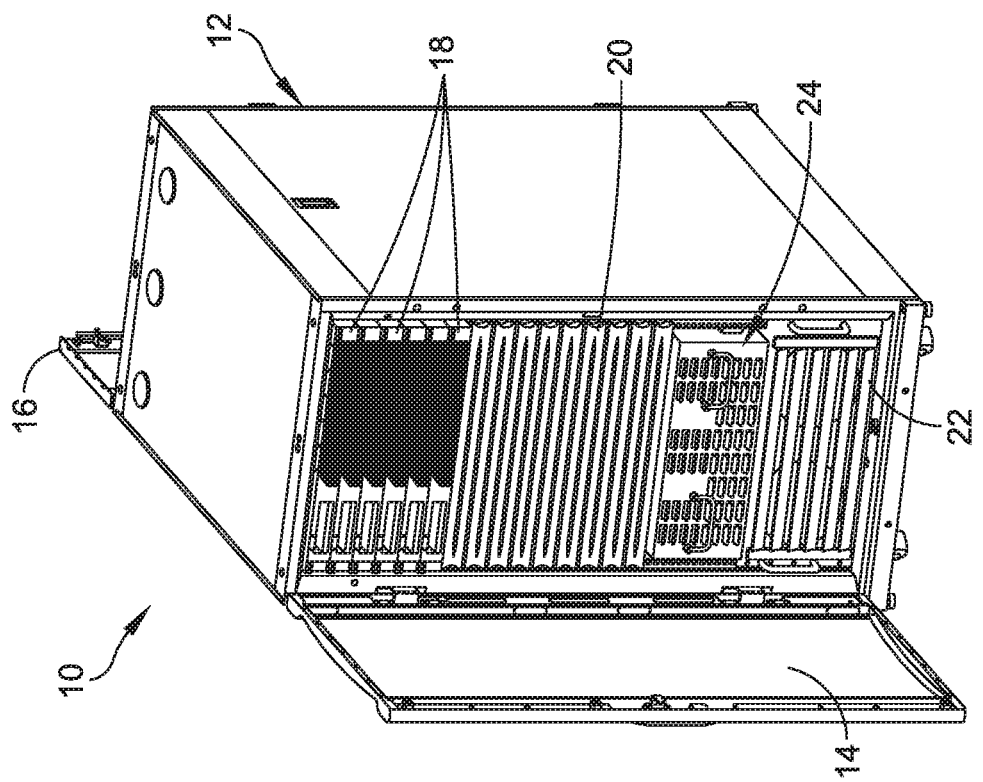
FIG. 2 is a front view of a combined equipment and cooling rack of an embodiment of the present disclosure.

Referring to the drawings, and more particularly to FIGS. 2 and 3, a combined equipment and cooling rack ("combined rack") of embodiments of the present disclosure is generally indicated at 10. As shown, the combined rack 10 includes a generally rectangular-shaped housing generally indicated at 12 having a front door 14 and a back door 16 that each enable access to an interior of the housing. The size of the combined rack 10 can embody any type of configuration, including an industry-standard rack, including 19-inch and 23-inch racks. The housing 12 of the combined rack 10 is configured to support electronic equipment, e.g., several servers, each indicated at 18, which are located at a top of the housing of the combined rack. The electronic equipment can include any type of equipment beyond servers 18, such as telecommunication, broadcast video, lighting, audio, and scientific lab equipment. Other types of electronic equipment are also contemplated, such as power supplies and uninterruptible power supplies.

In the shown embodiment, the servers 18 are horizontally oriented and are received within an upper portion of the interior of the housing 12 in a traditional manner, e.g., by use of slide rails. In other embodiments, the servers 18 can be vertically oriented. The servers 18 can occupy any number of slots within the interior of the housing 12. As shown, any space that does not include servers can be enclosed by one or more blanking panels, e.g., blanking panel 20, to improve the air flow to equipment and reduce internal hot air recirculation within the combined rack 10.

The combined rack 10 further includes a cooling unit 22 provided within a lower portion of the interior of the housing 12. The cooling unit 22 can embody a compressor, an evaporator having one or more heat exchangers, a condenser having one or more heat exchangers, a transfer fluid, and a controller, with the cooling unit providing cooling that is more than sufficient to cool the servers provided at the top of the combined rack 10. One cooling style can include an evaporator and fan assembly mounted within the combined rack 10, which is connected to a remote condensing unit via refrigerant lines for the refrigerant liquid supply from the condensing to the evaporator and refrigerant suction line to return the evaporated refrigerant from the evaporator back to the condensing unit. Another cooling style can include a self-contained air conditioner that draws air to be cooled from the hot air IT portion of the combined rack 10 through an evaporator by means of fan(s) within the self-contained air conditioner and discharging the cooled air back into the cool air IT portion of the combined rack. The self-contained air conditioner also houses the compressor, the condenser, and condenser fans. As will be described in greater detail with the embodiment of the combined rack 10, the cooling unit 22 can be provided in any position within the housing 12 of the combined rack, including an upper portion of the interior of the housing. The cooling unit 22 is configured to treat relatively warm IT air produced by the electronic equipment, e.g., the servers 18, and to deliver the chilled air back into the housing 12 of the combined rack 10 over the electronic equipment.

Provided between the servers 18 and the cooling unit 22, and below the blanking panel 20, is a thermal buffering module, which is generally indicated at 24. The thermal buffering module 24 is configured to detect low discharge air temperature and scavenge a portion of the excessively cooled discharge from cooling unit 22 through the thermal buffering module, where the air will thermally absorb heat. The thermal buffering module 24 includes a generally rectangular-shaped support housing generally indicated at 26 that is designed to slide into and out of the housing 12 of the combined rack 10. In one embodiment, the support housing 26 is configured to slide on rails provided within the interior of the housing 12 of the combined rack 10. An interior of the support housing 26 supports a thermal mass, which embodies one or more heat exchangers having a thermal transfer fluid, such as water or a phase change material, e.g., saturated salts. The heat exchangers are configured to cool warm air, such as warm IT air, when traveling over the outer surfaces of the heat exchangers. The thermal buffering module 24 further includes one or more fans provided at a front of the support housing 26 to discharge tempered or treated air from the thermal buffering module within the front of the combined rack 10 to balance the excessively cooled discharge air produced by the cooling unit 22. The product of mixed air streams then flowing into the electronic equipment, e.g., servers 18, at a temperature warmer than the excessively cooled air produced strictly from cooling unit 22.

Figure 4:
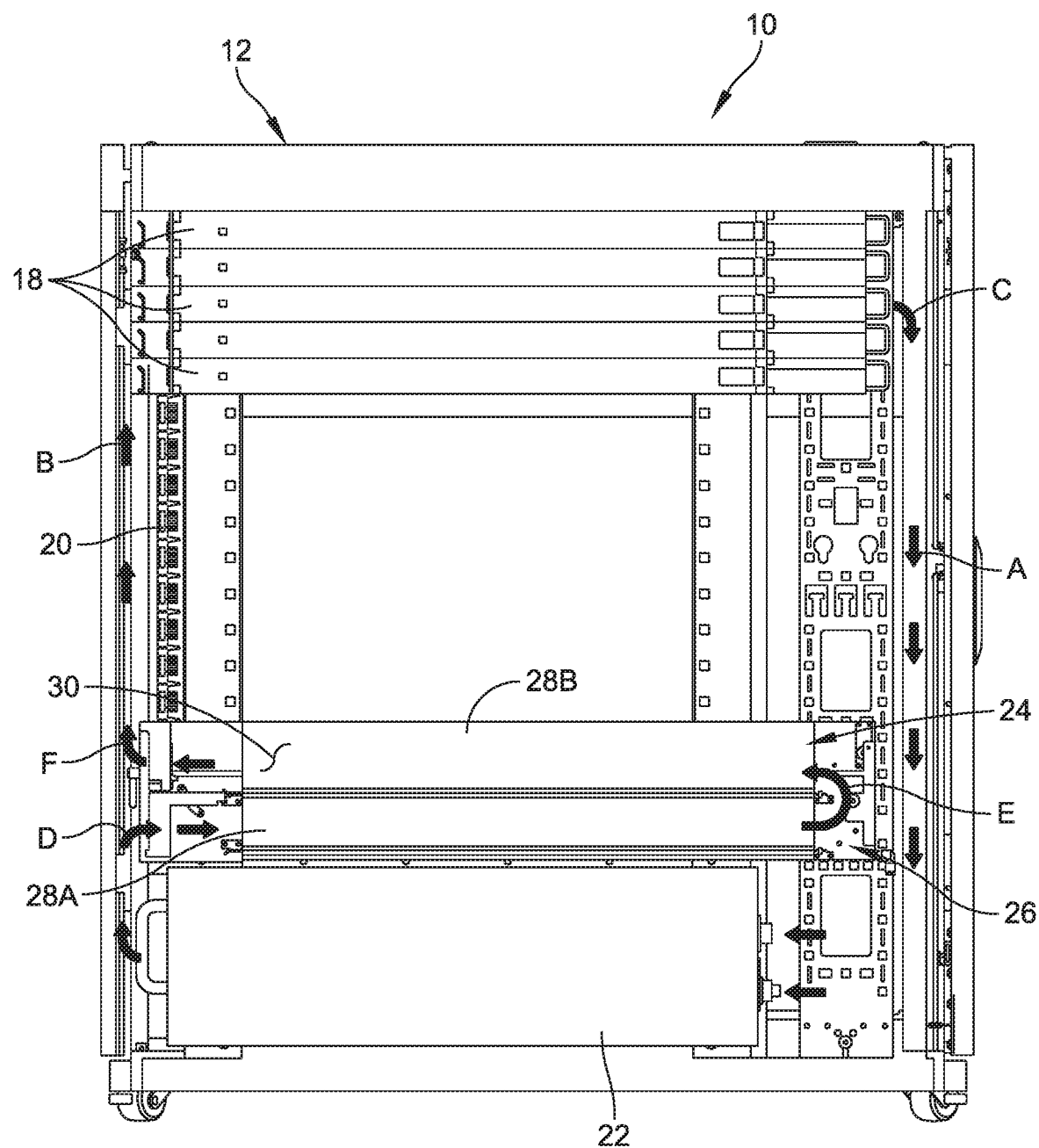
FIG. 4 is a cross-sectional side view of the combined equipment and cooling rack in an "on" cooling mode.

Referring to FIG. 4, the thermal buffering module 24 includes air passages 28A, 28B disposed within a heat exchanger 30, with surfaces of the heat exchanger also serving as the containment for a thermal mass, such as water, saturated salts, etc., contained therein. The thermal buffering module 24 can be configured with any number of heat exchangers, which are oriented in a suitable manner. FIG. 4 illustrates the thermal buffering module 24 in a "charging" or "on" mode of operation. Specifically, warm IT air produced by the servers 18 is directed through the back of the combined rack 10 at (indicated by arrow A), and is drawn through the cooling unit 22 provided at the bottom of the cooling unit. The warm IT air is cooled by the cooling unit 22, and chilled air is delivered to the front of the housing 12 of the combined rack 10 (indicated by arrow B) where the chilled air travels up the front of the housing of the combined rack to the servers 18 provided at the top of the combined rack. The chilled air then flows through the servers 18 to cool the servers, and warm IT air is exhausted out of the back of the housing 12 of the combined rack 10 where the tempered IT air is returned to the cooling unit 22 (indicated by arrow C), where the cycle begins again.

As mentioned above, during operation of the cooling unit 22, i.e., when a compressor of the cooling unit is operating, the cooling unit may have a tendency to overchill the warm IT air. Conversely, when not operating, the thermal transfer fluid (e.g., air) within the heat exchangers of the cooling unit 22 may have a tendency to overheat quickly. Thus, the cycling of overcooling and overheating is inefficient and somewhat ineffective in consistently cooling and maintaining the electronic equipment housed within the combined rack 10.

During operation of the cooling unit 22 of the combined rack 10, some of the chilled air is scavenged by the thermal buffering module 24. Specifically, the chilled air exiting the cooling unit 22 is drawn into the thermal buffering module 24 (indicated by arrow D) and travels through the first air passage 28A of the thermal buffering module. The chilled air further travels (e.g., front to rear) in thermal contact with a lower section of the heat exchanger 30 and the thermal mass contained within the heat exchanger through air passage 28A where the chilled air then loops around 180 degrees due to damper configuration (indicated by arrow E) and travels through an upper section of the heat exchanger through air passage 28B, where it exits the thermal buffering module 24 and is directed upwardly along the front of the housing 12 of the combined rack 10 toward the servers 18 (indicated by arrow F). The flow of chilled air through the first air passage 28A and the second air passage 28B of the thermal buffering module 24 chills the heat exchanger 30, and thus slightly warms the chilled air as it flows toward the servers 18 (along arrow B). Overchilling the servers 18 is prevented or significantly reduced.

Figure 5:
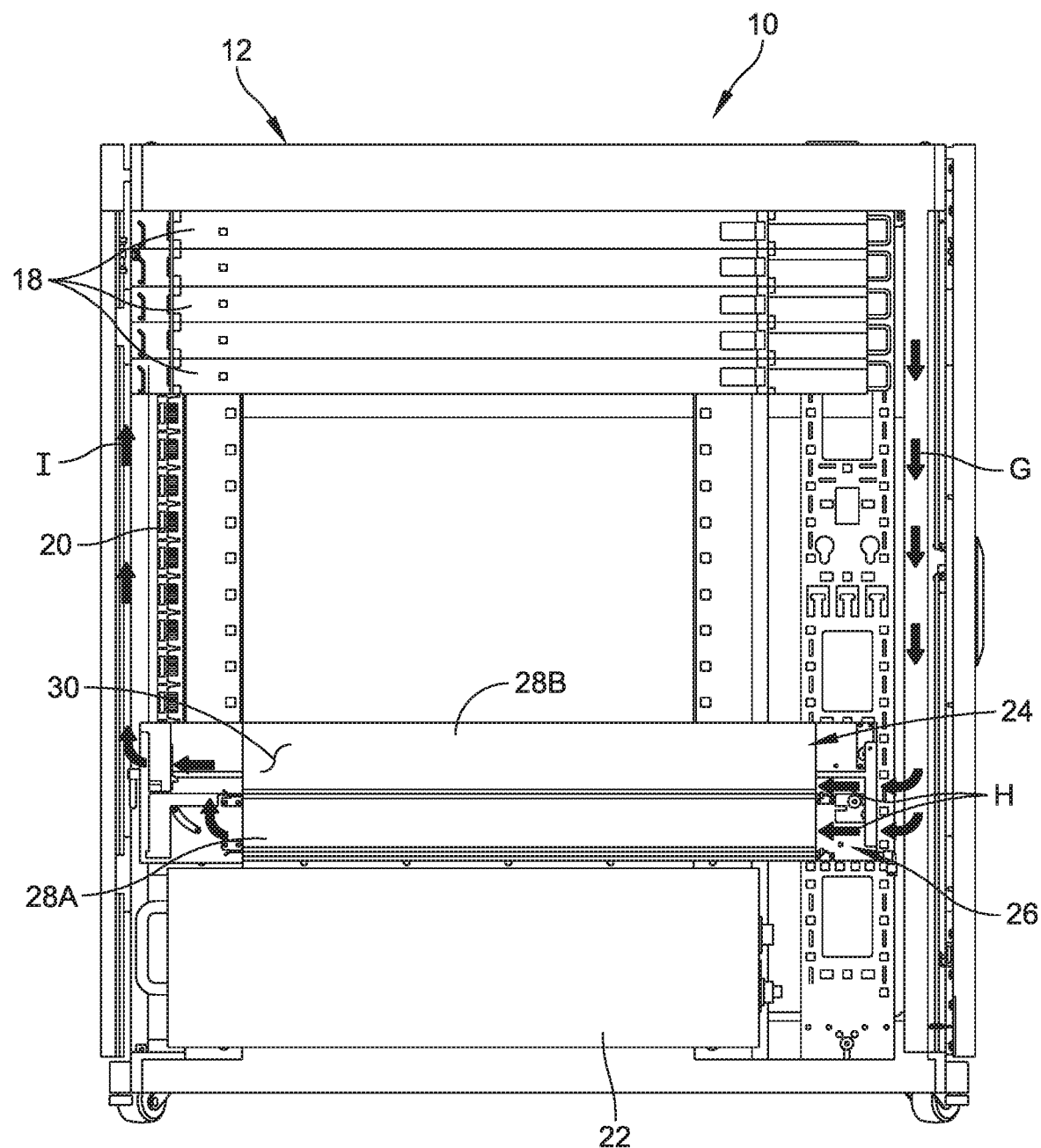
FIG. 5 is a cross-sectional side view of the combined equipment and cooling rack in an "off" cooling mode.

Referring to FIG. 5, the thermal buffering module 24 is in a "discharging" or "off" mode of operation. Specifically, when the cooling unit 22 of the combined rack 10 is not operating, warm IT air produced by the servers 18 is directed along the back of the housing 12 of the combined rack (indicated by arrow G), and is drawn through the thermal buffering module 24 (indicated by arrows H). The warm IT air is cooled by the first air passage 28A and the second air passage 28B of the charged thermal buffering module 24, and chilled air is delivered to the front of the thermal buffering module (indicated by arrow I) where the chilled air travels up along the front of the housing 12 of the combined rack 10 to the servers 18 provided at the top of the combined rack. The chilled air then flows through the servers 18 to cool the servers, and is exhausted out of the back of the housing 12 of the combined rack 10 where the warmed IT air is returned to the thermal buffering module 24.

Figure 7:
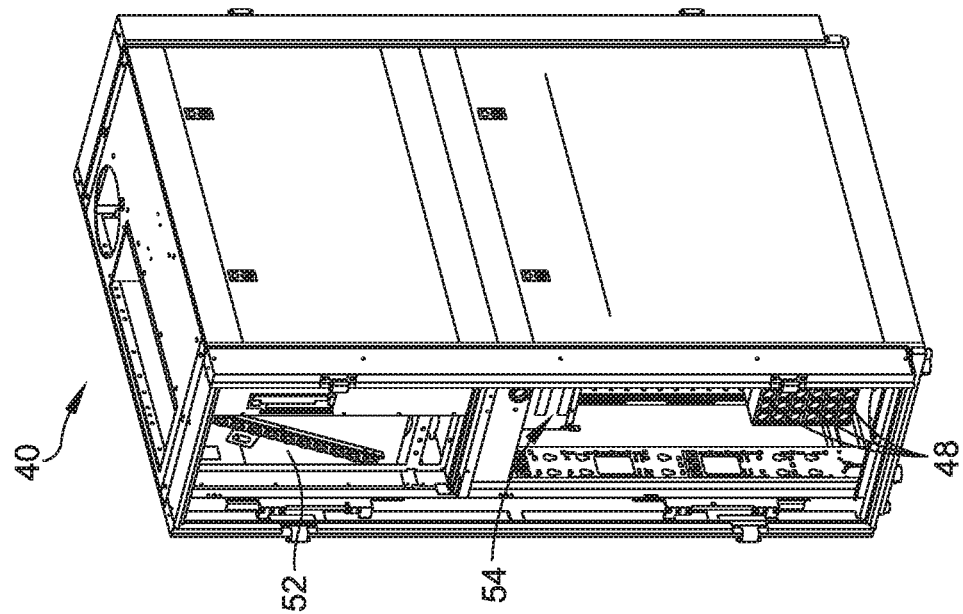
FIG. 7 is a perspective view of the combined equipment and cooling rack with doors removed.
Figure 6:
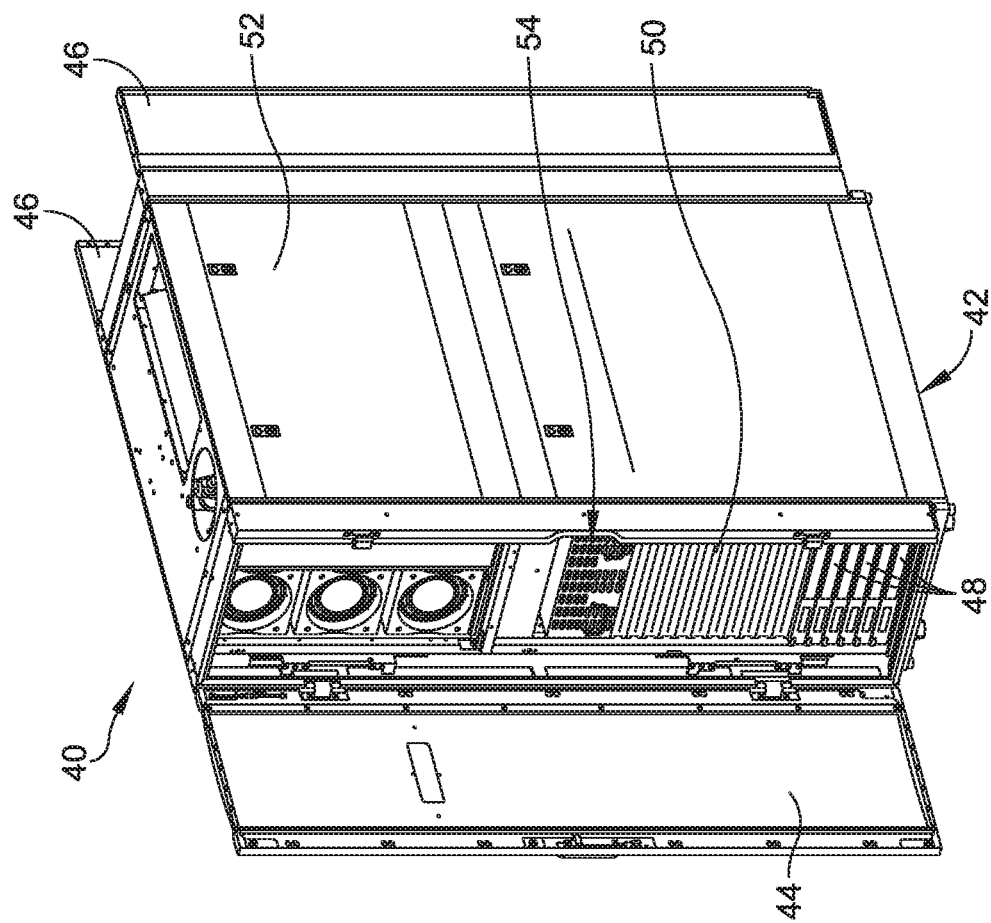
FIG. 6 is a perspective view of a combined equipment and cooling rack with doors open of another embodiment of the present disclosure.

Referring to FIGS. 6 and 7, a combined rack of another embodiment of the present disclosure is generally indicated at 40. As shown, the combined rack 40 includes a generally rectangular-shaped housing generally indicated at 42 having a front door 44 and two back doors, each indicated at 46, that each enable access to an interior of the housing. The housing 42 is configured to support electronic equipment, e.g., several servers, each indicated at 48, which are located at a bottom of the housing of the combined rack 40. The servers 48 are horizontally oriented and are received within a bottom portion of the interior of the housing 42 of the combined rack 40. As with combined rack 10, in other embodiments, the servers 48 can be vertically oriented. The servers 48 can occupy any number of slots within the interior of the housing 42. As shown, any space that does not include servers 48 can be enclosed by one or more blanking panels, e.g., blanking panel 50, to prevent air from entering the space. The combined rack 40 further includes a cooling unit 52 provided within an upper portion of the interior of the housing 42.

Provided between the servers 48 and the cooling unit 52 and below the blanking panel 50 is a thermal buffering module, which is generally indicated at 54. As with thermal buffering module 24, the thermal buffering module 54 is configured to detect low discharge air temperature and scavenge a portion of the excessively cooled discharge produced by the cooling unit 52 through the housing 42 of the combined rack 40, where the air will thermally absorb heat. The thermal buffering module 54 includes a generally rectangular-shaped support housing generally indicated at 56 that is designed to slide into and out of the housing 42 of the combined rack 40. An interior of the support housing 56 has a thermal mass, which embodies one or more heat exchangers having a thermal transfer fluid. The thermal buffering module 54 further includes one or more fans provided at a front of the support housing 56 to discharge tempered air within the front of the combined rack 40 to balance the excessively cooled discharge air produced by the cooling unit 52.

Figure 8:
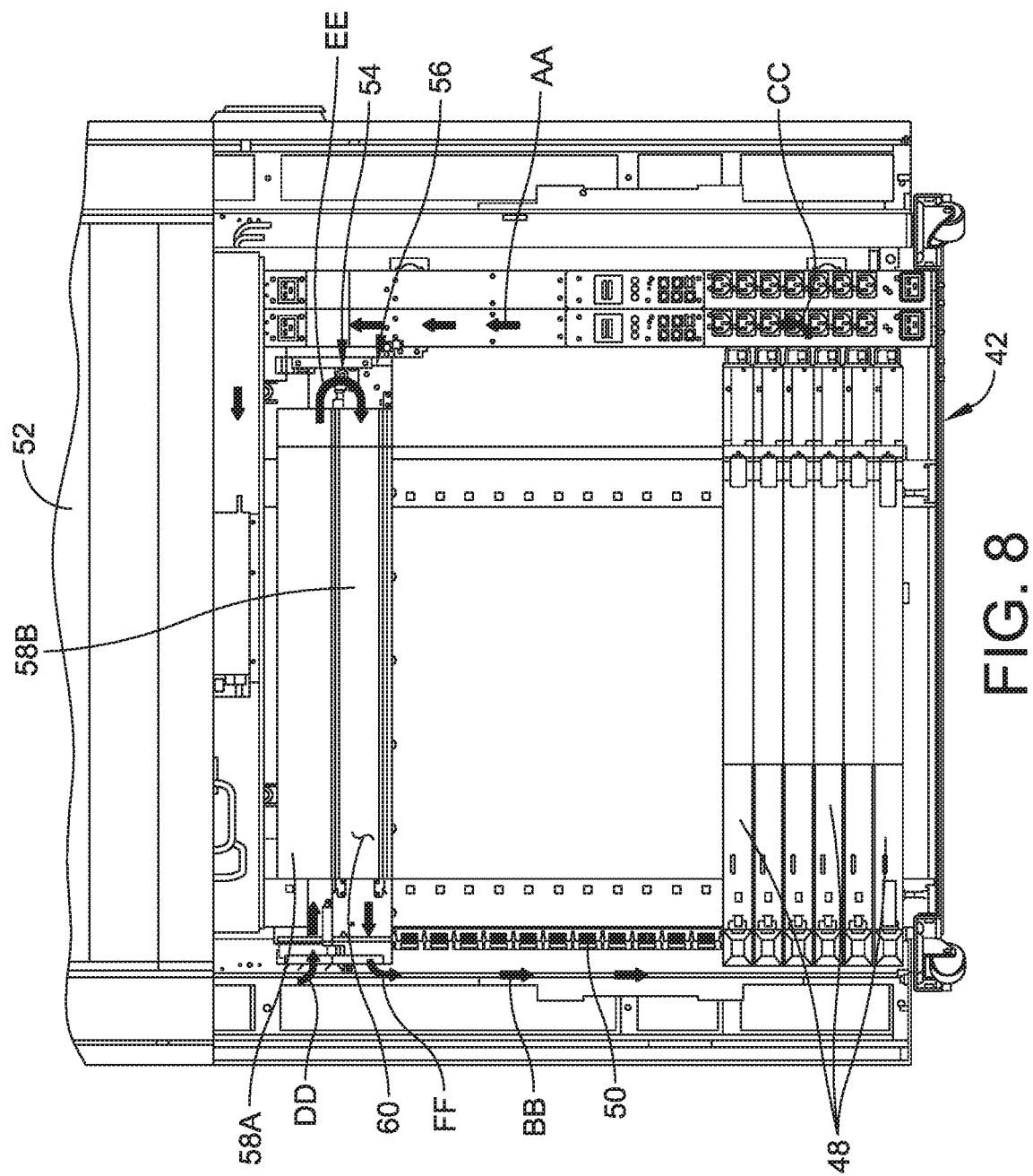
FIG. 8 is a cross-sectional side view of the combined equipment and cooling rack in an "on" cooling mode.

Referring to FIG. 8, the thermal buffering module 54 includes air passages 58A, 58B disposed within a heat exchanger 60, with surfaces of the heat exchanger also serving as the containment for a thermal mass, such as water, saturated salts, etc., contained therein. The first air passage 58A is disposed above a second air passage 58B. FIG. 8 illustrates the thermal buffering module 54 in a "charging" or "on" mode of operation. Specifically, warm IT air produced by the servers 48 is directed through the back of the housing 42 of the combined rack 40 (indicated by arrow AA), and is drawn through the cooling unit 52 provided at the top of the combined rack. The warm IT air is cooled by the cooling unit 52, and chilled air is delivered to the front of the housing 42 of the combined rack 40 (indicated by arrow BB) where the chilled air travels down to the servers 48 provided at the bottom of the combined rack 40. The chilled air then flows through the servers 48 to cool the servers, and is exhausted out of the back of the housing 42 of the combined rack 40 where the tempered air is returned to the cooling unit 52 (indicated by arrow CC).

During operation of the cooling unit 52 of the combined rack 40, some of the chilled air is scavenged by the thermal buffering module 54. Specifically, the chilled air exiting the cooling unit 52 is drawn into the thermal buffering module 54 (indicated by arrow DD) and travels through the air passage 58A. The chilled air further travels from the first air passage 58A to the second air passage 58B (indicated by arrow EE), where it exits the thermal buffering module 54 and is directed downwardly along a front of the housing 42 of the combined rack 40 toward the servers 48 (indicated by arrow FF). The flow of chilled air through the first air passage 58A and the second air passage 58B of the thermal buffering module 24 chills the heat exchanger 60 and thus slightly warms the chilled air as it flows toward the servers 18 (along arrow B).

Referring to FIG. 9, when the thermal buffering module 54 of the combined rack 40 is in a "discharging" or "off" mode of operation, warm IT air produced by the servers 48 is directed through the back of the housing 42 of the combined rack (indicated by arrow GG), and is drawn through the thermal buffering module (indicated by arrow HH). The warm IT air is cooled by the heat exchanger 60 of the charged thermal buffering module 54, and chilled air is delivered to the front of the housing 42 of the combined rack 40 (indicated by arrow II) where the chilled air travels downwardly to the servers 48 provided at the bottom of the combined rack. The chilled air then flows through the servers 48 to cool the servers, and is exhausted out of the back of the housing 42 of the combined rack 40 where the warmed IT air is returned to the thermal buffering module 54.

Referring to FIGS. 10-13, the details of construction of the thermal buffering module 24 that is used with the below cooling configuration of combined rack 10 is illustrated. As shown, the support housing 26 of the thermal buffering module includes a front 70, a back 72, a top 74, a bottom 76, and two sides 78, 80. In the shown embodiment, the "top" and "bottom" parts wrap around to form the "sides" of the support housing 26. In one embodiment, each side 78, 80 includes a slide assembly 82 to facility insertion into and out of the interior of the housing 12 of the combined rack 10. The front 70 of the support housing 26 of the thermal buffering module 24 includes a louvered surface having several vents each indicated at 84 that reveal several, e.g., three, fans, each indicated at 86, to move air through the support housing 26. In one embodiment, the fans 86 are positioned adjacent the front 70 of the support housing 26 and are configured to draw air into the thermal buffering module 24 from the back 72 of the module toward the front of the module. Two handles, each indicated at 88, are provided to enable an operator to remove the thermal buffering module 24 from the housing 12 of the combined rack 10. A drain port 90 (FIG. 11) is provided to enable fluid to be drained from the heat exchanger 30 of the thermal buffering module 24, or from a condensation pan provided at the bottom 76 of the support housing 26. A top cover 92 is removed in FIGS. 12 and 13 to reveal the interior of the support housing 26 of the thermal buffering module 24.

The first air passage exchanger 28A is separated from the second air passage 28B of the thermal buffering module 24 by a horizontal divider 94. In one embodiment, another horizontal divider 96 is positioned below the first air passage 28A above the bottom 76 of the support housing 26. The back 72 of the support housing 26 of the thermal buffering module 24 includes a first air inlet damper 98 to enable or inhibit warm IT air from entering the thermal buffering module 24. In a certain embodiment, the first damper 98 is a rotating damper, and is configured to rotate between an open position to enable air to pass through elongate vents, each indicated at 100, provided at the back 72 of the support housing 26 and a closed position to block air from passing through the vents. The front 70 of the support housing 26 of the thermal buffering module 24 includes a second air inlet damper 102 to enable or inhibit chilled air produced by the cooling unit 52 from entering the thermal buffering module. As with the first damper 98, the second damper 102 is a rotating damper, and is configured to rotate between an open position to enable air to pass through vents 84 created by the louvered surface formed in the front 70 of the support housing 26 and a closed position to block air from passing through the vents 84.

In FIG. 12, when in a "charging" or "on" mode of operation, the first damper 98 is closed to inhibit warm IT air from entering the vents 100 provided in the back 72 of the thermal buffering module 24. Thus, the warm IT air travels directly to the cooling unit 22 along the back of the housing 12 to be chilled by the cooling unit. The second damper 102 is open to enable chilled air to enter the vents 84 provided in the front 70 of the thermal buffering module 24 so that the chilled air enters the first air passage 28A of the thermal buffering module and travels through the second air passage 28B to cool the heat exchanger 30 of the thermal buffering module, thereby charging the heat exchanger.

In FIG. 13, when in a "discharging" or "off" mode of operation, the first damper 98 is open to enable warm IT air to enter the back of the thermal buffering module 24. Thus, the warm IT air travels directly into the first air passage 28A and the second air passage 28B of the thermal buffering module 24 to heat the heat exchanger 30. The second damper 102 is closed to inhibit chilled air to enter the front 70 of the thermal buffering module 24 and to direct the warm IT air chilled by the thermal buffering module to the servers 18 provided at the top of the combined rack 10.

Referring to FIGS. 14-17, the details of construction of the thermal buffering module 54 that is used with the above cooling configuration of combined rack 40 is illustrated. As shown, the support housing 56 of the thermal buffering module 54 includes a front 110, a back 112, a top 114, a bottom 116, and two sides 118, 120. In one embodiment, each side 118, 120 includes a slide assembly 122 to facility insertion into and out of the interior of the housing 42 of the combined rack 40. The front 110 of the support housing 56 of the thermal buffering module 54 includes a louvered surface having several vents each indicated at 124 that that reveal several, e.g., three, fans, each indicated at 126, to move air through the support housing. In one embodiment, the fans 126 are positioned adjacent the front 70 of the support housing 56 and are configured to draw air into the thermal buffering module 54 from the back 72 of the module toward the front of the module. Two handles 128 are provided to enable an operator to remove the thermal buffering module 54 from the housing 42 of the combined rack 40. A drain port 130 (FIG. 11) is provided to enable fluid to be drained from the heat exchanger 60 of the thermal buffering module 54, or from a condensation pan provided at the bottom 76 of the support housing 56. A top cover 132 is removed in FIGS. 16 and 17 to reveal the interior of the support housing 56 of the thermal buffering module 54.

The first air passage 58A is separated from the second air passage 58B by a horizontal divider 134. In one embodiment, another horizontal divider 136 is positioned below the heat exchanger 60 above a bottom 76 of the support housing 56. The back 112 of the support housing 56 of the thermal buffering module 54 includes a first air inlet damper 138 to enable or inhibit warm IT air from entering the thermal buffering module. In a certain embodiment, the first damper 138 is a rotating damper, and is configured to rotate between an open position to enable air to pass through elongate vents, each indicated at 140, provided at the back 112 of the support housing 56 and a closed position to block air from passing through the vents. The front 110 of the support housing 56 of the thermal buffering module 54 includes a second air inlet damper 142 to enable or inhibit chilled air produced by the cooling unit 52 from entering the thermal buffering module. As with the first damper 138, the second damper 142 is a rotating damper, and is configured to rotate up to achieve a closed position.

Figure 16:
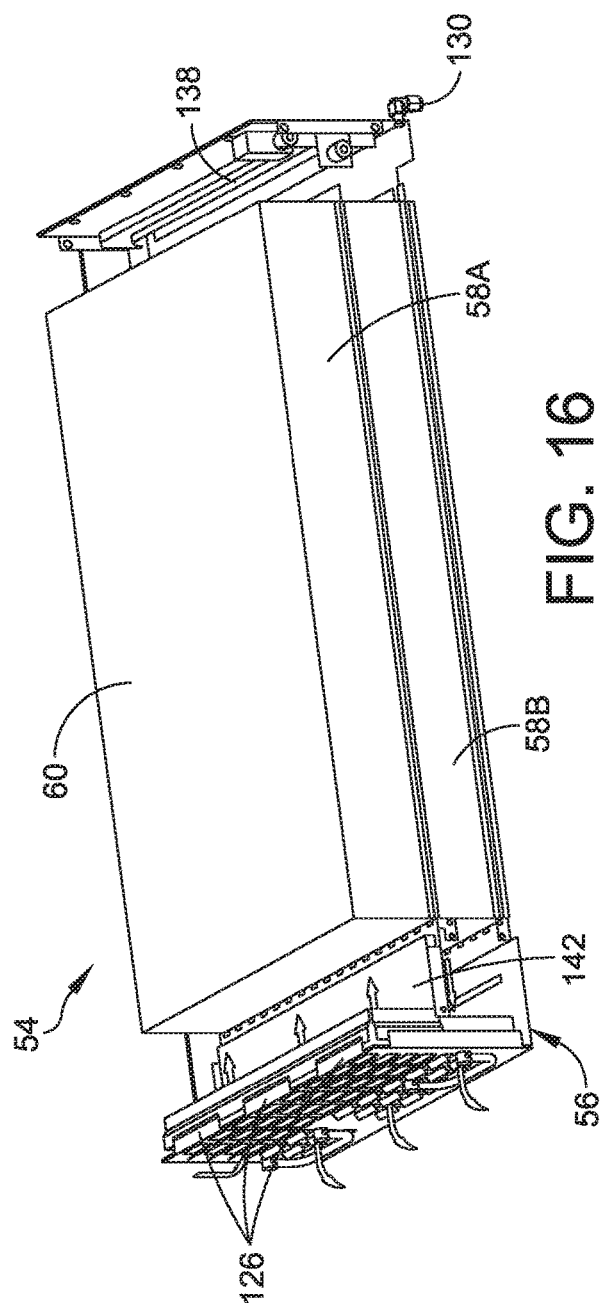
FIG. 16 is a perspective view of the thermal buffering module shown in FIGS. 14 and 15 with a top cover removed to reveal the thermal buffering module in an "on" cooling mode.

In FIG. 16, when in a "charging" or "on" mode of operation, the first damper 138 is closed to inhibit warm IT air from entering the vents 140 provided in the back 72 of the thermal buffering module 54. Thus, the warm IT air travels directly to the cooling unit 52. The second damper 142 is open to enable chilled air to enter the vents 124 provided in the front 110 of the thermal buffering module 54 so that the chilled air enters the first passage 58A and travels through the second passage 58B of the heat exchanger 60 to cool the heat exchanger of the thermal buffering module, thereby charging the heat exchanger.

Figure 17:
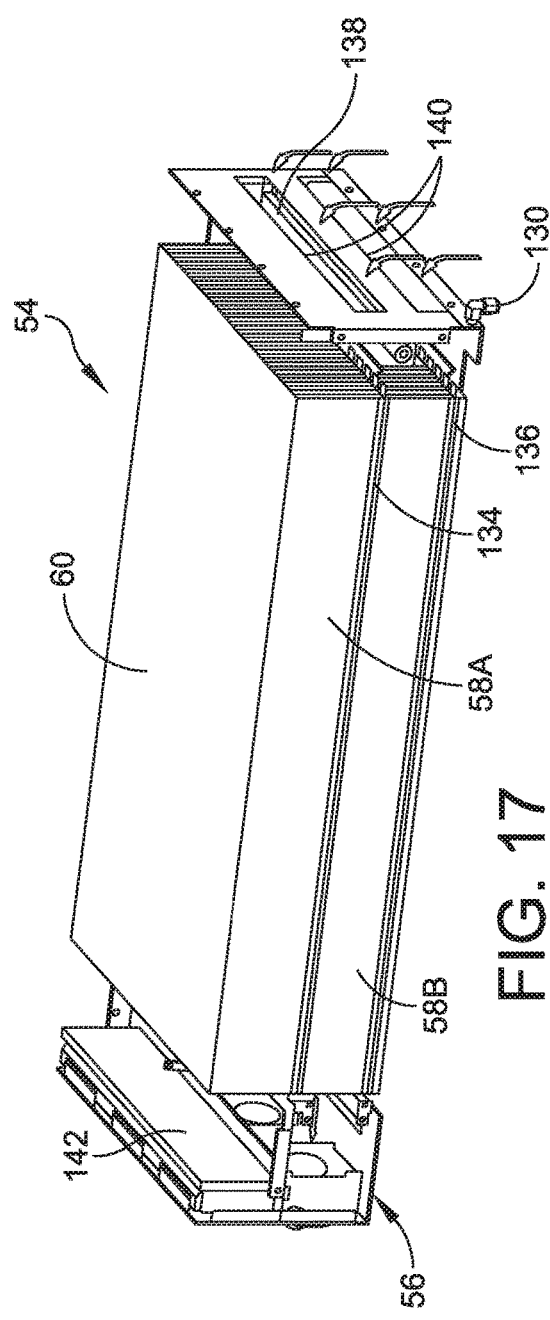
FIG. 17 is a perspective view of the thermal buffering module shown in FIGS. 14 and 15 with the top cover removed to reveal the thermal buffering module in an "off" cooling mode.

In FIG. 17, when in a "discharging" or "off" mode of operation, the first damper 138 is open to enable warm IT air to enter the back 112 of the thermal buffering module 54. Thus, the warm IT air travels directly into the first air passage 58A and the second air passage 58B of the heat exchanger 60 of the thermal buffering module 54. The second damper 142 is closed to inhibit chilled air to enter the front 110 of the support housing 56 of the thermal buffering module 54 and to direct the warm IT air chilled by the thermal buffering module 54 along the front of the housing 42 of the combined rack 40 to the servers 48 provided at the bottom of the combined rack.

Figure 19:
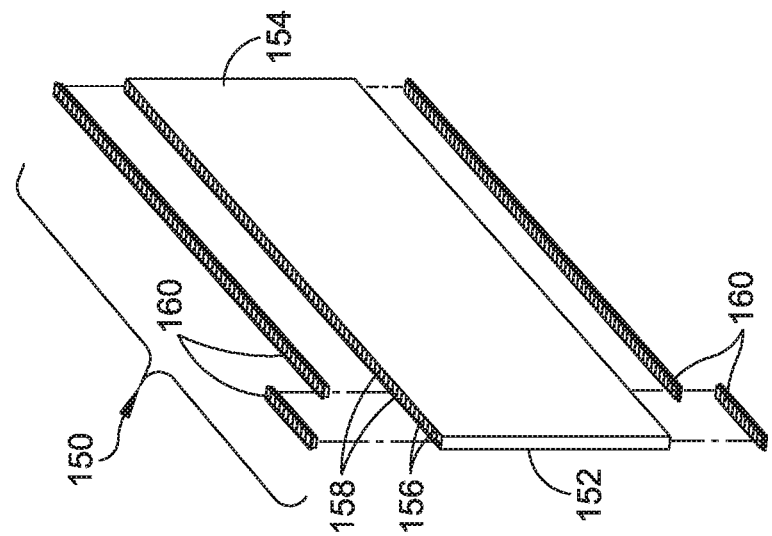
FIG. 19 is an exploded perspective view of the panel of the thermal buffering module.
Figure 18:
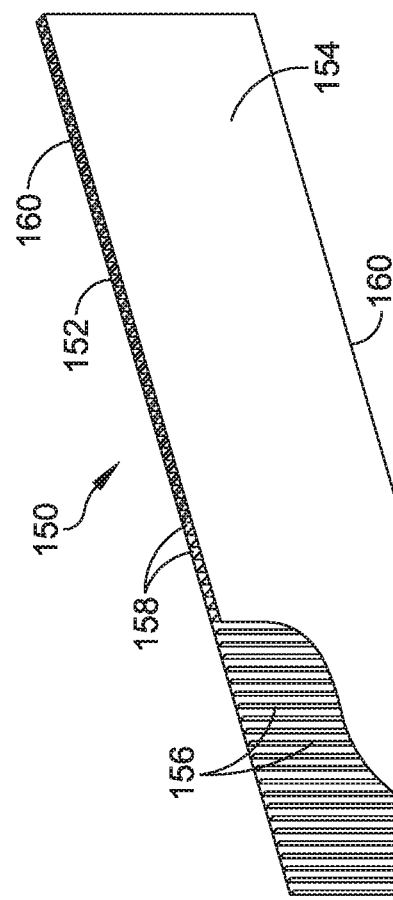
FIG. 18 is a perspective view of a panel of a thermal buffering module of an embodiment of the present disclosure.

Referring to FIGS. 18 and 19, in one embodiment, an exemplary heat exchanger is generally indicated at 150. The exemplary heat exchanger 150 embodies the air passages 28A, 28B, 58A, 58B and the heat exchangers 30 and 60 used with thermal buffering modules 24, 54, respectively. As shown, the heat exchanger 150 includes a multiwall panel assembly having a first panel 152, a second panel 154, and a plurality of separation members, each indicated at 156, that extend between the first and second panels to create columns, each indicated at 158. In one embodiment, the panel assembly is fabricated from a suitable plastic material, e.g., a thermoplastic polymer. Each column 158 is filled with a thermal transfer fluid, e.g., water or a phase change material. The columns 158 are sealed by plastic caps, each indicated at 160, that are sealingly secured to a bottom and a top of the panel assembly. The caps 160 can be secured by any suitable method, such as glue, silicone or welding.

Figure 21:
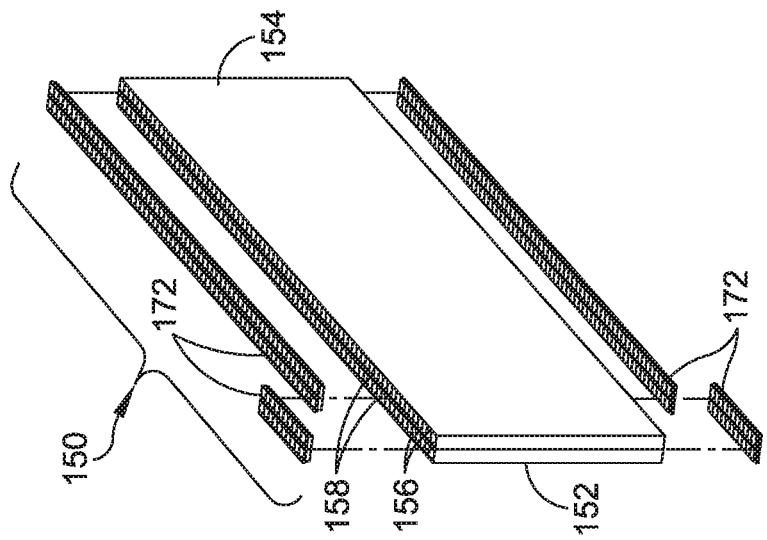
FIG. 21 is an exploded perspective view of the panel of the thermal buffering module.
Figure 20:
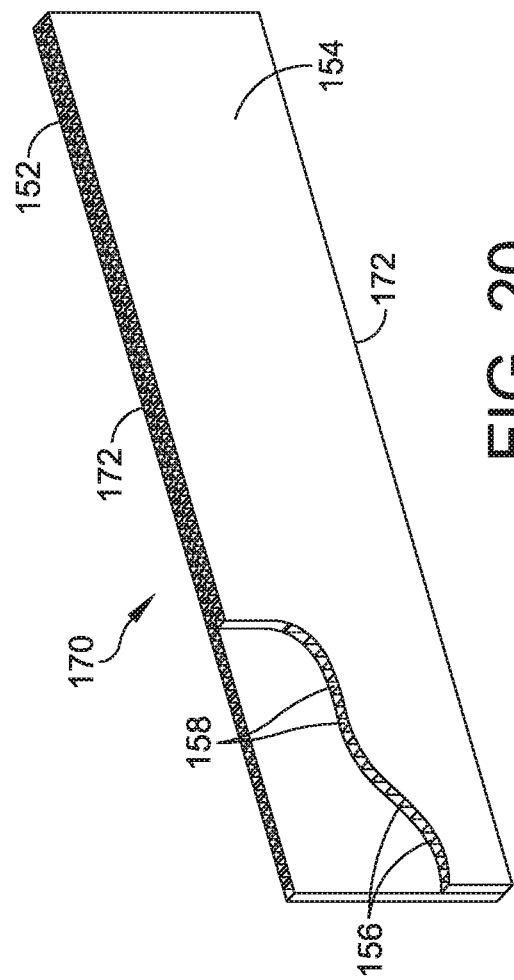
FIG. 20 is a perspective view of a panel of a thermal buffering module of another embodiment of the present disclosure.

Referring to FIGS. 20 and 21, in another embodiment, a heat exchanger, generally indicated at 170, includes a double panel structure having a first panel assembly and a second panel assembly secured to one another. As with heat exchanger 150, the first panel assembly and the second panel assembly of heat exchanger 170 each includes the first panel 152, the second panel 154, and the plurality of separation members 156 that extend between the first and second panels to create columns 158. Each column 158 is filled with a thermal transfer fluid, e.g., water or a phase change material. The columns 158 are sealed by plastic caps, each indicated at 172, that are sealingly secured to a bottom and a top of the secured panel assemblies. The caps 172 can be secured by any suitable method, such as glue, silicone or welding. As shown, the caps 172 are wider than caps 160 to accommodate the width of the double panel structure.

In certain embodiments, the controller may be employed to control the operation of the combined rack. In one embodiment, the controller may be a dedicated unit associated with the cooling unit and the thermal buffering module. In another embodiment, the controller may be provided as part of an integrated data center control and monitoring system. In yet another embodiment, each combined rack may be independently operable by a controller provided in the combined rack that is in communication with controllers of the other combined racks. Notwithstanding the particular configuration, the controller is designed to control the independent operation of the combined rack within the data center.

In another embodiment, one combined rack may operate as the main or master unit and the other combined racks operate as subservient units that operate under the control of the main unit. In this embodiment, the main combined rack may be manipulated by the data center operator to control the entire combined rack. For example, the controller may be configured to receive information from the combined racks so as to determine the amount of power being drawn by each rack. With this knowledge, the controller may be configured to increase the cooling capacity of certain cooling units within the combined racks based on the energy drawn by the combined racks.

In one embodiment, the controller may embody only controller unit provided in the combined racks that communicate with one another over a controller area network (CAN) Bus. In other embodiments, a master controller may be provided to control the operation of the controller units. Changes to the environmental conditions, such as the temperature of the data center, results in changes of inputs including the temperature of the refrigerant flowing into and out of the cooling units associated with the combined racks.

Figure 22:
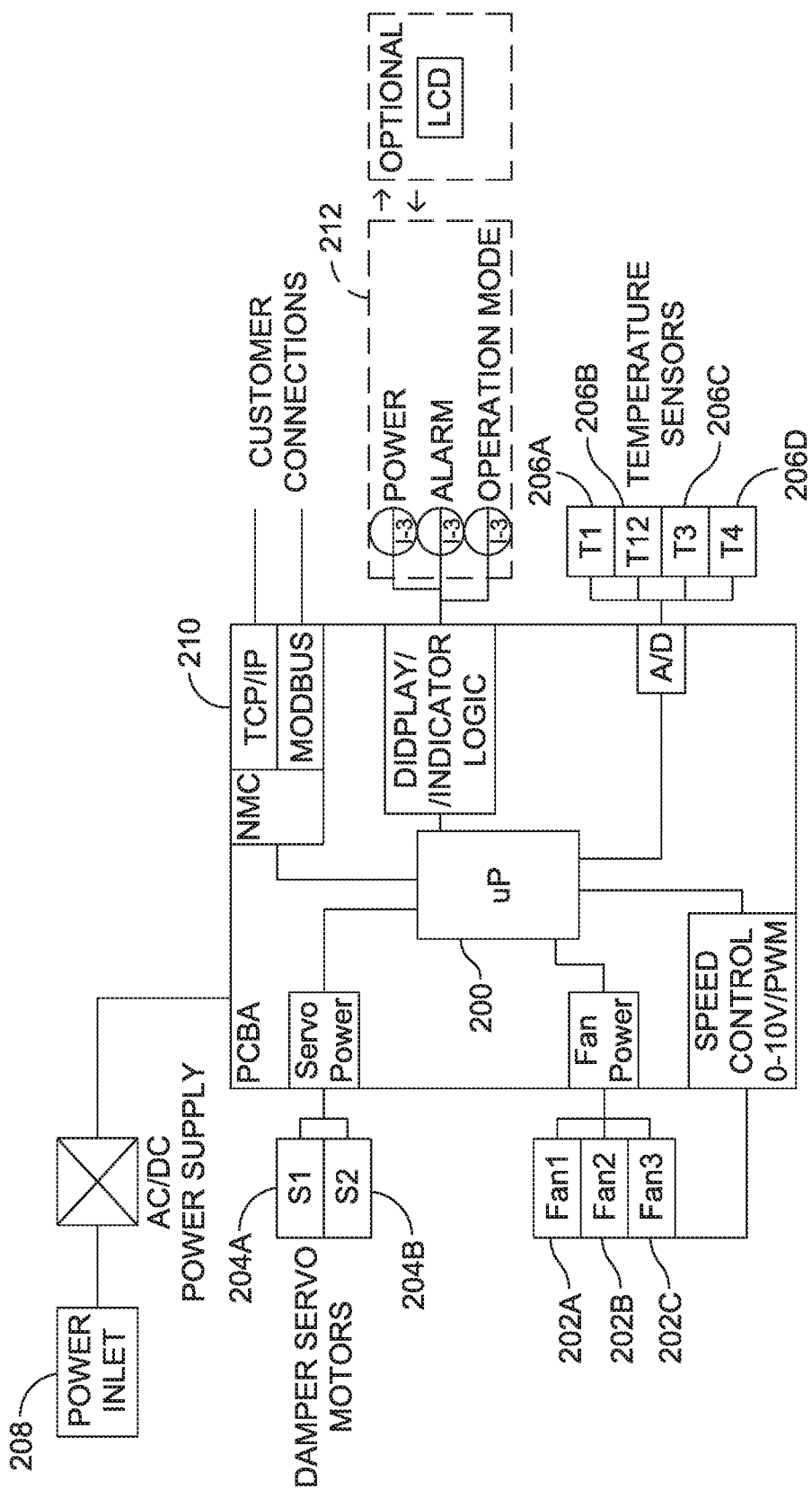
FIG. 22 is a control diagram of a self-contained cooling unit of an enclosed equipment rack of an embodiment of the present disclosure.

Referring to FIG. 22, a control diagram is provided to show the operating controls of an exemplary thermal buffering module. As shown, a microcontroller 200 is used to control the operation of fans 202A, 202B, 202C and dampers 204A, 204B of the thermal buffering module. The operation of the fans 202A, 202B, 202C and the dampers 204A, 204B is based on temperature readings taken from temperature sensors 206A, 206B, 206C, 206D. The temperature sensors 206A, 206B, 206C, 206D are located at the dampers and at the fans. A power source 208 is provided, as well as customer connection 210 and power/alarm/operation indicator 212.

Figure 23:
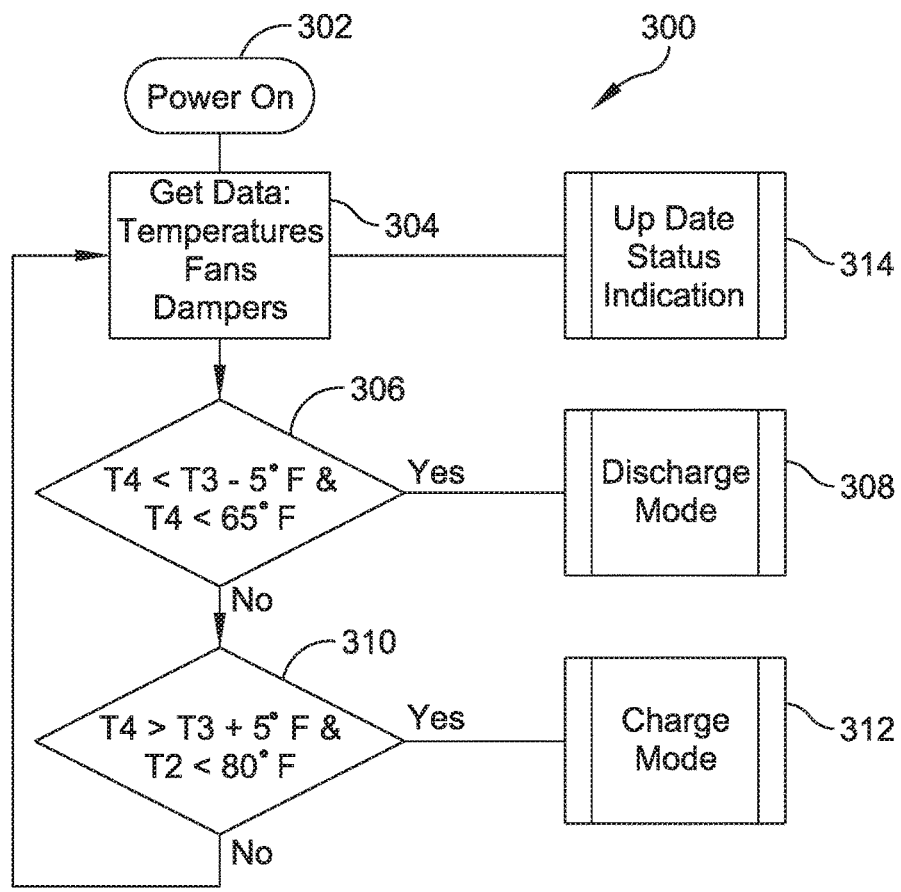
FIG. 23 is a flow diagram of the operation of a self-contained cooling unit of an enclosed equipment rack of an embodiment of the present disclosure.
Figure 24:
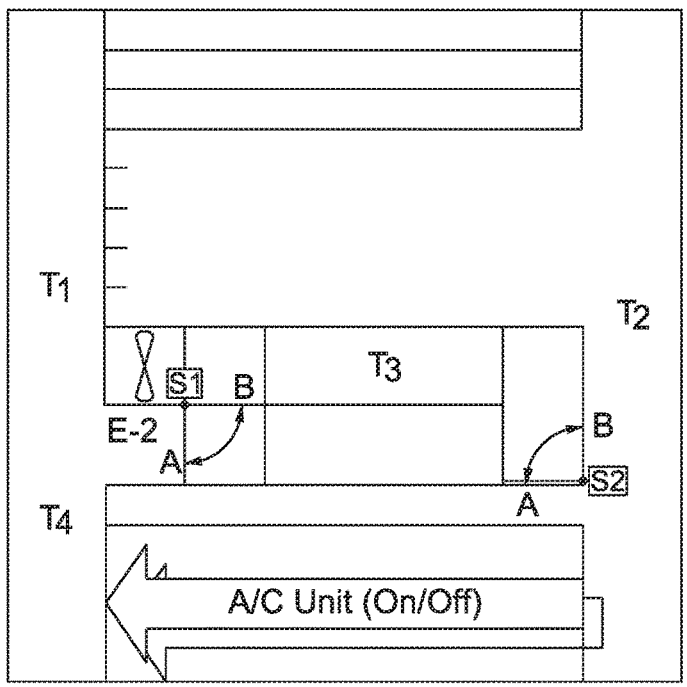
FIG. 24 is a schematic view of a self-contained cooling unit of an embodiment of the present disclosure during operation.

Referring to FIGS. 23 and 24, the operation of the exemplary thermal buffering module is indicated at 300. At 302, the power of the thermal buffering module is turned on. At 304, data is received by the microcontroller from the temperature sensors positioned at the dampers, at the fans, and at the heat exchanger. By way of example, at 306, if the temperature of the damper located at the front of the thermal buffering module is less than the temperature of the damper located at the back of the thermal buffering module less 5° F., for example, and the temperature of the heat exchanger of the thermal buffering module is less than 65° F., then the thermal buffering module is set to the charge mode of operation at 308.

If not, at 310, if the temperature of the damper located at the front of the thermal buffering module is greater than the temperature of the heat exchanger of the thermal buffering module plus 5° F., for example, and the temperature of the damper located at the back of the thermal buffering module is greater than 80° F., then the thermal buffering module is set to the discharge mode of operation at 312. The thermal buffering module can be programmed to operate in the charge mode of operation and the discharge mode of operation based on operator programming. At 310, if the temperature of the damper located at the front of the thermal buffering module is greater than the temperature of the heat exchanger of the thermal buffering module plus 5° F. and the temperature of the damper located at the back of the thermal buffering module is greater than 80° F., then the process goes back to step 304. An update of the status of the thermal buffering module, e.g., whether the module is in charge mode or discharge mode, is indicated at 314.

Figure 25:
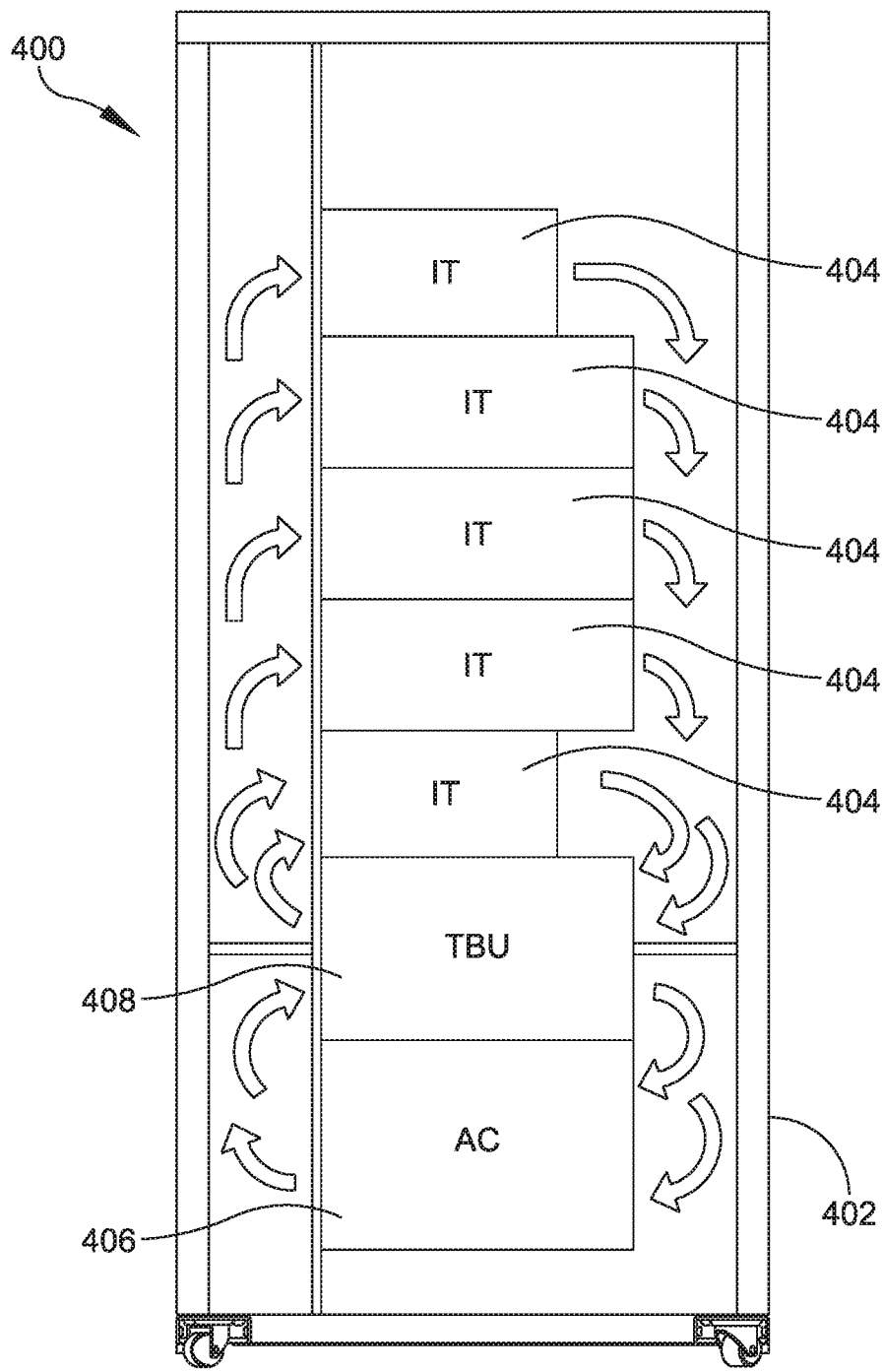
FIG. 25 is a schematic view of a combined equipment and cooling rack of another embodiment of the present disclosure.

Referring to FIG. 25, a combined equipment and cooling rack of another embodiment of the present disclosure is generally indicated at 400. As shown, the combined rack 400 includes a generally rectangular-shaped housing 402 having a front door and a back door that each enable access to an interior of the housing. The size of the combined rack 400 can embody any type of configuration, including an industry-standard rack, including 19-inch and 23-inch racks. The housing 402 is constructed similarly to housing 12 of combined rack 10 and is configured to support electronic equipment, e.g., several servers, each indicated at 404, which are located at a top of the housing of the combined rack.

The combined rack 400 further includes a cooling unit 406 provided within a lower portion of the interior of the housing 402. The cooling unit 406 can embody a compressor, an evaporator having one or more heat exchangers, a condenser having one or more heat exchangers, a transfer fluid, and a controller, with the cooling unit providing cooling that is more than sufficient to cool the servers provided at the top of the combined rack 400. One cooling style can include an evaporator and fan assembly mounted within the combined rack 400, which is connected to a remote condensing unit via refrigerant lines for the refrigerant liquid supply from the condensing to the evaporator and refrigerant suction line to return the evaporated refrigerant from the evaporator back to the condensing unit. Another cooling style can include a self-contained air conditioner that draws air to be cooled from the hot air IT portion of the combined rack 400 through an evaporator by means of fan(s) within the self-contained air conditioner and discharging the cooled air back into the cool air IT portion of the combined rack. The self-contained air conditioner also houses the compressor, the condenser, and condenser fans. As will be described in greater detail with the embodiment of the combined rack 400, the cooling unit 406 can be provided in any position within the housing 402 of the combined rack, including an upper portion of the interior of the housing. The cooling unit 406 is configured to treat relatively warm IT air produced by the electronic equipment, e.g., the servers 404, and to deliver the chilled air back into the housing 402 of the combined rack 400 over the electronic equipment.

Provided between the servers 404 and the cooling unit 406 is a thermal buffering module, which is generally indicated at 408. The thermal buffering module 408 is configured to detect low discharge air temperature and scavenge a portion of the excessively cooled discharge from cooling unit 406 through the thermal buffering module, where the air will thermally absorb heat. The thermal buffering module 408 includes a generally rectangular-shaped support housing that is designed to slide into and out of the housing 402 of the combined rack 400. In one embodiment, the support housing of the thermal buffering module 408 is configured to slide on rails provided within the interior of the housing 402 of the combined rack 400. An interior of the support housing of the thermal buffering module 408 has a thermal mass, which embodies one or more heat exchangers having a thermal transfer fluid, such as water or a phase change material, e.g., saturated salts. The heat exchangers are configured to cool warm air, such as warm IT air, when traveling over the outer surfaces of the heat exchangers. The thermal buffering module 408 further includes one or more fans provided at a front of the support housing to discharge tempered or treated air from the thermal buffering module within the front of the combined rack 400 to balance the excessively cooled discharge air produced by the cooling unit 406. The product of mixed air streams then flowing into the electronic equipment, e.g., servers 404, at a temperature warmer than the excessively cooled air produced strictly from cooling unit 406.

Figure 26:
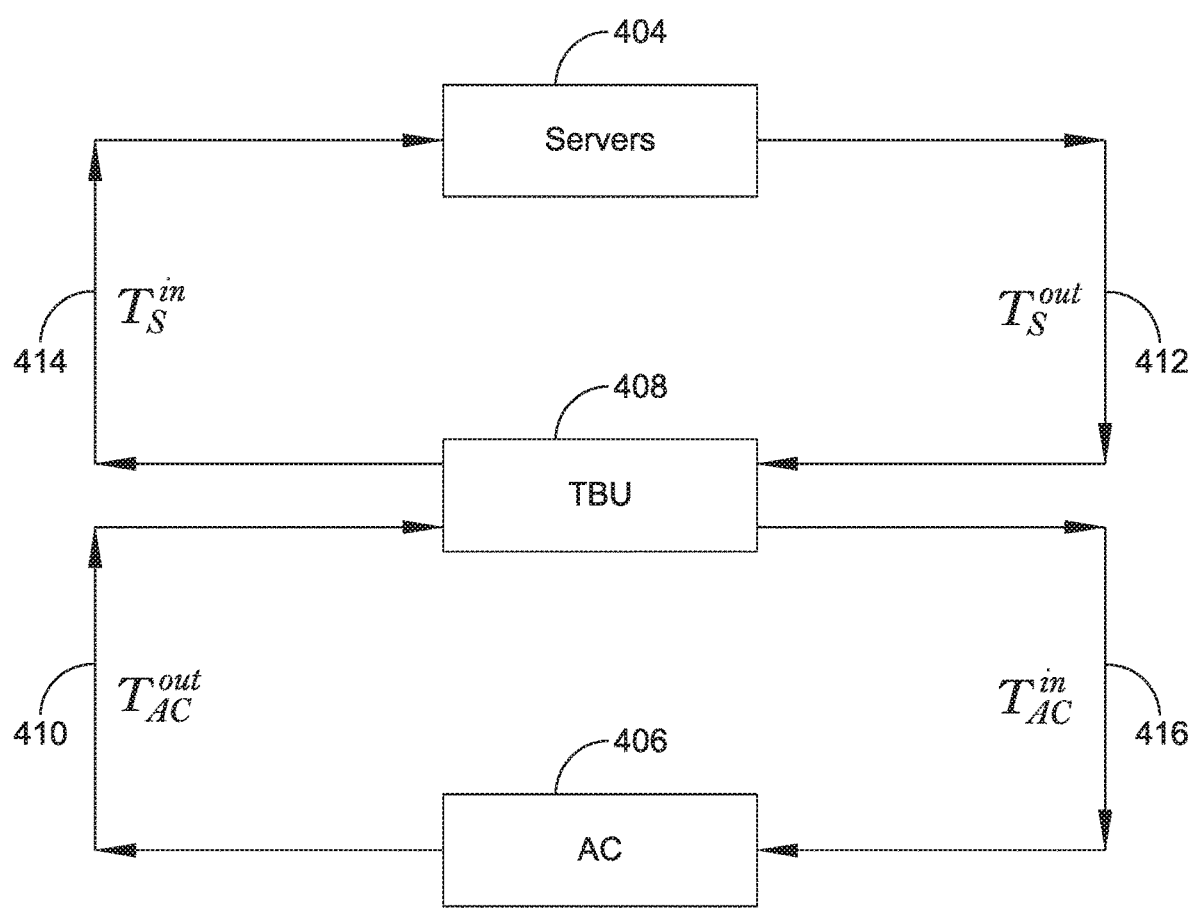
FIG. 26 is a schematic view of airflow within the combined equipment and cooling rack shown in FIG. 25.

Referring additionally to FIG. 26, the thermal buffering module 408 includes air passages disposed within a heat exchanger, with surfaces of the heat exchanger also serving as the containment for a thermal mass, such as water, saturated salts, etc., contained therein. The thermal buffering module 408 can be configured with any number of heat exchangers, which are oriented in a suitable manner During operation, cool air produced by the cooling unit 406 is directed through the combined rack 400, and is drawn through the thermal buffering module 408 as indicated by arrow 410. Separately, warm IT air produced by the servers 404 is directed through the combined rack 400, and is drawn through the thermal buffering module 408 as indicated by arrow 412.

The arrangement is such that the thermal buffering module 408 is configured to cool the warm IT air produced by the servers 404 in which the cooled air travels back to the servers as indicated by arrow 414. Concurrently, the cool air used to cool the warm IT air travels back to the cooling unit 406 as indicated by arrow 416. During the cycling of a compressor of the cooling unit 406 of the combined rack 400 when the compressor is in an "on" condition, the chilled air produced by the cooling unit is scavenged by the thermal buffering module 408 to cool the warm IT air. In one embodiment, when the cooling unit 406 is not operating, the thermal mass (heat exchanger) of the thermal buffering module 408 continues to cool the warm IT air generated by the servers 404 until a temperature of air entering the servers 404 exceeds a certain setpoint temperature thereby activating the cooling unit 406. In another embodiment, in addition to the temperature of air entering the servers 404 from the thermal buffering module 408, the temperature of air entering the thermal buffering module from the servers 404, and/or the temperature of air entering the thermal buffering module from the cooling unit 406, and/or the temperature of entering the cooling unit from the thermal buffering module also can be monitored to control the operation of the cooling unit. In one example, temperature sensors can be positioned at 410, 412, 414, 416 to measure temperature between the cooling unit 406 and the thermal buffering module 408, between the servers 404 and the thermal buffering module, between the thermal buffering module and the servers, and between the thermal buffering module and the cooling unit respectively.

The combined rack 400 and/or the thermal buffering module 408 can be configured to include partitions located at the front and the rear of the combined rack 400 into two separate loops. In one embodiment, horizontal partition would be at approximately the mid-height of the thermal buffering module so that the hot return stream from the IT equipment heats the thermal mass in the thermal buffering module while the cooling unit 406 cools it. This design has the potential to eliminate dampers/shutters in the thermal buffering module as well as any external control system (e.g., for dampers/shutters). The compressor of the cooling unit 406 is configured to turn "on" and "off" based on its internal setpoints while the sharp temperature spikes are moderated by the thermal mass provided in the thermal buffering module. This results in the servers 404 experiencing much more uniform inlet temperatures.

Having thus described several aspects of at least one embodiment of this disclosure, it is to be appreciated various alterations, modifications, and improvements will readily occur to those skilled in the art. Such alterations, modifications, and improvements are intended to be part of this disclosure, and are intended to be within the spirit and scope of the disclosure. Accordingly, the foregoing description and drawings are by way of example only.

What is claimed is:

1. A thermal buffering module for use in a combined equipment and cooling unit including a housing defining an interior configured to receive electronic equipment, the electronic equipment being supported by the housing within an interior of the housing, and the cooling unit supported by the housing, the thermal buffering module comprising:
   at least one heat exchanger; and
   a first air inlet damper to selectively enable or inhibit warm IT air from entering the thermal buffering module,
   wherein the thermal buffering module is configured to selectively receive chilled air from the cooling unit to cool the at least one heat exchanger and to selectively receive warm IT air from the electronic equipment to cool the warm IT air as it travels over the at least one heat exchanger.

2. The thermal buffering module of claim 1, further comprising a support housing.

3. The thermal buffering module of claim 2, wherein the support housing is configured to slide into and out of the interior of the housing of the combined equipment and cooling unit.

4. The thermal buffering module of claim 2, wherein the support housing includes a louvered surface.

5. The thermal buffering module of claim 2, wherein the support housing includes at least one fan.

6. The thermal buffering module of claim 1, wherein the at least one heat exchanger includes a first air passage and a second air passage.

7. The thermal buffering module of claim 6, wherein the first air passage is separated from the second air passage by a divider.

8. The thermal buffering module of claim 1, wherein the thermal buffering module is further configured to operate in a charging mode of operation in which chilled air produced by the cooling unit is directed over the at least one heat exchanger and warm IT air produced by the electronic equipment is directed through the cooling unit.

9. The thermal buffering module of claim 1, wherein the thermal buffering module is further configured to operate in a discharging mode of operation in which warm IT air produced by the electronic equipment is directed through the thermal buffering module and over the at least one heat exchanger to cool the warm IT air.

10. The thermal buffering module of claim 1, wherein the first air inlet damper is configured to rotate between an open position to enable air to pass through vents provided in a support housing and a closed position.

11. The thermal buffering module of claim 1, further comprising a second air inlet damper to selectively enable or inhibit chilled air from entering the thermal buffering module.

12. The thermal buffering module of claim 11, wherein the second air inlet damper is configured to rotate between an open position to enable air to pass through openings of the front of the support housing and a closed position.

13. The thermal buffering module of claim 11, wherein when in a charging mode of operation, the first air inlet damper is closed to inhibit warm IT air from entering the back of the thermal buffering module and warm IT air travels to the cooling unit to be chilled by the cooling unit, and the second air inlet damper is opened to enable chilled air to enter the front of the thermal buffering module so that the chilled air enters the at least one heat exchanger to cool the at least one heat exchanger.

14. The thermal buffering module of claim 11, wherein when in a discharging mode of operation, the first air inlet damper is opened to enable warm IT air to enter the back of the thermal buffering module so that the warm IT air travels over the at least one heat exchanger, and the second air inlet damper is closed.

15. The thermal buffering module of claim 1, wherein the at least one heat exchanger includes a multiwall panel assembly having a first panel, a second panel, and a plurality of cross members that extend between the first and second panels to create columns, wherein at least one column is filled with a thermal transfer fluid.

16. The thermal buffering module of claim 15, wherein the columns are sealed by plastic caps in contact with at least one end of the panel assembly.

17. A computer readable medium configured to cause a controller to perform a method of cooling warm IT air in a combined equipment and cooling unit, the combined equipment and cooling unit including a housing defining an interior configured to receive electronic equipment, electronic equipment supported by the housing within an interior of the housing, a cooling unit supported by the housing, and a thermal buffering module as set forth in claim 1, the method comprising:
    in a charging mode of operation, chilled air produced by the cooling unit is directed over the at least one heat exchanger of the thermal buffering module and warm IT air produced by the electronic equipment is directed through the cooling unit; and
    in a discharging mode of operation, warm IT air produced by the electronic equipment is directed through the thermal buffering module and over the at least one heat exchanger to cool the warm IT air.

18. The computer readable medium of claim 17, wherein the first air inlet damper is configured to rotate between an open position to enable air to pass through vents provided in the support housing and a closed position to block air from passing through the vents, and wherein the thermal buffering module further includes a second air inlet damper to selectively enable or inhibit chilled air from entering the thermal buffering module, the second air inlet damper is configured to rotate between an open position to enable air to pass through openings provided in the support housing and a closed position to block air from passing through the openings.

19. The computer readable medium of claim 18, wherein when in a charging mode of operation, the first air inlet damper is closed to inhibit warm IT air from entering the back of the thermal buffering module and warm IT air travels directly to the cooling unit to be chilled by the cooling unit, and the second air inlet damper is opened to enable chilled air to enter the front of the thermal buffering module so that the chilled air enters the at least one heat exchanger to cool the at least one heat exchanger, and wherein when in a discharging mode of operation, the first air inlet damper is opened to enable warm IT air to enter the back of the thermal buffering module so that the warm IT air travels directly over the at least one heat exchanger, and the second air inlet damper is closed to inhibit chilled air to enter the front of the thermal buffering module.

20. A thermal buffering module for use in a combined equipment and cooling unit including a housing defining an interior configured to receive electronic equipment, the electronic equipment being supported by the housing within an interior of the housing, and a cooling unit supported by the housing, the thermal buffering module comprising:
    at least one heat exchanger,
    wherein the thermal buffering module is configured to selectively receive chilled air from the cooling unit to cool the at least one heat exchanger and to selectively receive warm IT air from the electronic equipment to cool the warm IT air as it travels over the at least one heat exchanger, and
    wherein the at least one heat exchanger includes a multiwall panel assembly having a first panel, a second panel, and a plurality of cross members that extend between the first and second panels to create columns, wherein at least one column is filled with a thermal transfer fluid.

21. The thermal buffering module of claim 20, wherein the columns are sealed by plastic caps in contact with at least one end of the panel assembly.

\* \* \* \* \*